US 8,423,938 B2

(12) United States Patent
Tsubamoto

(10) Patent No.: US 8,423,938 B2
(45) Date of Patent: Apr. 16, 2013

(54) WIRE SPACING VERIFICATION METHOD, WIRE SPACING VERIFICATION APPARATUS, AND COMPUTER-READABLE MEDIUM

(75) Inventor: Daita Tsubamoto, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 78 days.

(21) Appl. No.: 13/074,330

(22) Filed: Mar. 29, 2011

(65) Prior Publication Data

US 2011/0246956 A1 Oct. 6, 2011

(30) Foreign Application Priority Data

Mar. 31, 2010 (JP) .................................. 2010-80271

(51) Int. Cl.
*G06F 17/50* (2006.01)
*G06F 9/455* (2006.01)

(52) U.S. Cl.
USPC ............................ 716/113; 716/110; 716/118

(58) Field of Classification Search .................. 716/110, 716/113, 118
See application file for complete search history.

(56) References Cited

U.S. PATENT DOCUMENTS

| 6,028,989 | A * | 2/2000 | Dansky et al. ................. 716/115 |
| 6,434,726 | B1 * | 8/2002 | Goossen ........................ 333/246 |
| 6,480,996 | B1 * | 11/2002 | Aji et al. ........................ 716/129 |
| 6,539,527 | B2 * | 3/2003 | Naffziger et al. ............. 716/115 |
| 6,546,529 | B1 * | 4/2003 | Dansky et al. ................ 716/115 |
| 6,925,404 | B2 * | 8/2005 | Corr .............................. 702/117 |
| 6,971,077 | B1 * | 11/2005 | Frank et al. ................... 716/112 |
| 7,137,097 | B1 * | 11/2006 | Aji et al. ........................ 716/129 |
| 7,784,010 | B1 * | 8/2010 | Balsdon et al. ............... 716/118 |
| 2008/0155483 | A1 * | 6/2008 | Chen et al. ........................ 716/5 |
| 2011/0057302 | A1 * | 3/2011 | Spehar et al. ................. 257/693 |

FOREIGN PATENT DOCUMENTS

| JP | 5-54092 | 3/1993 |
| JP | 09-44550 | 2/1997 |
| JP | 2001-93982 | 4/2001 |
| JP | 2002-90403 | 3/2002 |
| JP | 2002-163320 | 6/2002 |

\* cited by examiner

*Primary Examiner* — Vuthe Siek
*Assistant Examiner* — Magid Dimyan
(74) *Attorney, Agent, or Firm* — Staas & Halsey LLP

(57) ABSTRACT

A wire-spacing verification method for a computer includes calculating a characteristic impedance of each wire model disposed in a substrate model on a basis of a propagation rate of a signal in the wire model and rise time or fall time of an element model for transmitting the signal, calculating a reference impedance for predetermined sections, creating a distribution map in a direction of a section length with respect to the characteristic impedance of each of the sections for which the reference impedance is calculated, calculating an index indicating a degree of mismatch with the reference impedance, on a basis of the created distribution map, and making an approval/denial determination on the wire model on a basis of the index.

10 Claims, 30 Drawing Sheets

| INPUT CONDITION | | | | CALCULATION RESULT |
|---|---|---|---|---|
| DIELECTRIC CONSTANT | LAYER PITCH (mm) | WIRE WIDTH (mm) | WIRE SPACING (mm) | DIFFERENTIAL IMPEDANCE Z0 ($\Omega$) |
| 3.8 | 0.2 | 0.1 | 0.3 | 90.0 |
| 3.8 | 0.2 | 0.1 | 0.4 | 95.0 |
| 3.8 | 0.2 | 0.1 | 0.5 | 100.0 |
| 3.8 | 0.2 | 0.15 | 0.3 | 85.5 |
| 3.8 | 0.2 | 0.15 | 0.4 | 90.3 |
| 3.8 | 0.2 | 0.15 | 0.5 | 95.0 |
| 3.8 | 0.2 | 0.2 | 0.3 | 81.2 |
| 3.8 | 0.2 | 0.2 | 0.4 | 85.7 |
| 3.8 | 0.2 | 0.2 | 0.5 | 90.3 |
| 3.8 | 0.3 | 0.1 | 0.3 | 94.5 |
| 3.8 | 0.3 | 0.1 | 0.4 | 99.8 |
| 3.8 | 0.3 | 0.1 | 0.5 | 100.0 |
| 3.8 | 0.3 | 0.15 | 0.3 | 89.8 |
| 3.8 | 0.3 | 0.15 | 0.4 | 94.8 |
| 3.8 | 0.3 | 0.15 | 0.5 | 99.8 |
| 3.8 | 0.3 | 0.2 | 0.3 | 85.3 |
| 3.8 | 0.3 | 0.2 | 0.4 | 90.0 |
| 3.8 | 0.3 | 0.2 | 0.5 | 94.8 |
| 3.8 | 0.4 | 0.1 | 0.3 | 99.0 |
| 3.8 | 0.4 | 0.1 | 0.4 | 104.5 |
| 3.8 | 0.4 | 0.1 | 0.5 | 110.0 |
| 3.8 | 0.4 | 0.15 | 0.3 | 94.1 |
| 3.8 | 0.4 | 0.15 | 0.4 | 99.3 |
| 3.8 | 0.4 | 0.15 | 0.5 | 104.5 |
| 3.8 | 0.4 | 0.2 | 0.3 | 89.3 |
| 3.8 | 0.4 | 0.2 | 0.4 | 94.3 |
| 3.8 | 0.4 | 0.2 | 0.5 | 99.3 |

| INPUT CONDITION | | | | CALCULATION RESULT |
|---|---|---|---|---|
| DIELECTRIC CONSTANT | LAYER PITCH (mm) | WIRE WIDTH (mm) | WIRE SPACING (mm) | DIFFERENTIAL IMPEDANCE Z0 ($\Omega$) |
| 4.3 | 0.2 | 0.1 | 0.3 | 85.5 |
| 4.3 | 0.2 | 0.1 | 0.4 | 90.3 |
| 4.3 | 0.2 | 0.1 | 0.5 | 95.0 |
| 4.3 | 0.2 | 0.15 | 0.3 | 81.2 |
| 4.3 | 0.2 | 0.15 | 0.4 | 85.7 |
| 4.3 | 0.2 | 0.15 | 0.5 | 90.3 |
| 4.3 | 0.2 | 0.2 | 0.3 | 77.2 |
| 4.3 | 0.2 | 0.2 | 0.4 | 81.5 |
| 4.3 | 0.2 | 0.2 | 0.5 | 85.7 |
| 4.3 | 0.3 | 0.1 | 0.3 | 89.8 |
| 4.3 | 0.3 | 0.1 | 0.4 | 94.8 |
| 4.3 | 0.3 | 0.1 | 0.5 | 99.8 |
| 4.3 | 0.3 | 0.15 | 0.3 | 85.3 |
| 4.3 | 0.3 | 0.15 | 0.4 | 90.0 |
| 4.3 | 0.3 | 0.15 | 0.5 | 94.8 |
| 4.3 | 0.3 | 0.2 | 0.3 | 81.0 |
| 4.3 | 0.3 | 0.2 | 0.4 | 85.5 |
| 4.3 | 0.3 | 0.2 | 0.5 | 90.0 |
| 4.3 | 0.4 | 0.1 | 0.3 | 94.1 |
| 4.3 | 0.4 | 0.1 | 0.4 | 99.3 |
| 4.3 | 0.4 | 0.1 | 0.5 | 104.5 |
| 4.3 | 0.4 | 0.15 | 0.3 | 89.3 |
| 4.3 | 0.4 | 0.15 | 0.4 | 94.3 |
| 4.3 | 0.4 | 0.15 | 0.5 | 99.3 |
| 4.3 | 0.4 | 0.2 | 0.3 | 84.9 |
| 4.3 | 0.4 | 0.2 | 0.4 | 89.6 |
| 4.3 | 0.4 | 0.2 | 0.5 | 94.3 |

| NET NUMBER | PAIR RECOGNITION | WIRE LAYER | DIELECTRIC CONSTANT | LAYER PITCH (mm) | WIRE WIDTH (mm) | WIRE SPACING (mm) | START POINT(mm) | | END POINT(mm) | |
|---|---|---|---|---|---|---|---|---|---|---|
| | | | | | | | X COORDINATE | Y COORDINATE | X COORDINATE | Y COORDINATE |
| 1 | 1POSI | L3 | 4.3 | 0.11 | 0.305 | 1.1 | 10 | 10 | 20 | 100 |
| 2 | 1NEGA | L3 | 4.3 | 0.11 | 0.305 | | 20 | 20 | 30 | 110 |
| 3 | 2POSI | L5 | 4.3 | 0.11 | 0.305 | 0.9 | 35 | 35 | 45 | 150 |
| 4 | 2NEGA | L5 | 4.3 | 0.11 | 0.305 | | 45 | 45 | 55 | 160 |
| 5 | 3POSI | L3 | 4.3 | 0.11 | 0.305 | 0.9 | 60 | 60 | 70 | 175 |
| 6 | 3NEGA | L3 | 4.3 | 0.11 | 0.305 | | 70 | 70 | 80 | 180 |
| 7 | 4POSI | L8 | 4.3 | 0.11 | 0.305 | 1.0 | 85 | 85 | 95 | 180 |
| 8 | 4NEGA | L8 | 4.3 | 0.11 | 0.305 | | 95 | 95 | 105 | 190 |
| 9 | 5POSI | L3 | 4.3 | 0.11 | 0.305 | 7.1 | 110 | 110 | 120 | 120 |
| 10 | 5NEGA | L3 | 4.3 | 0.11 | 0.305 | | 120 | 120 | 130 | 130 |

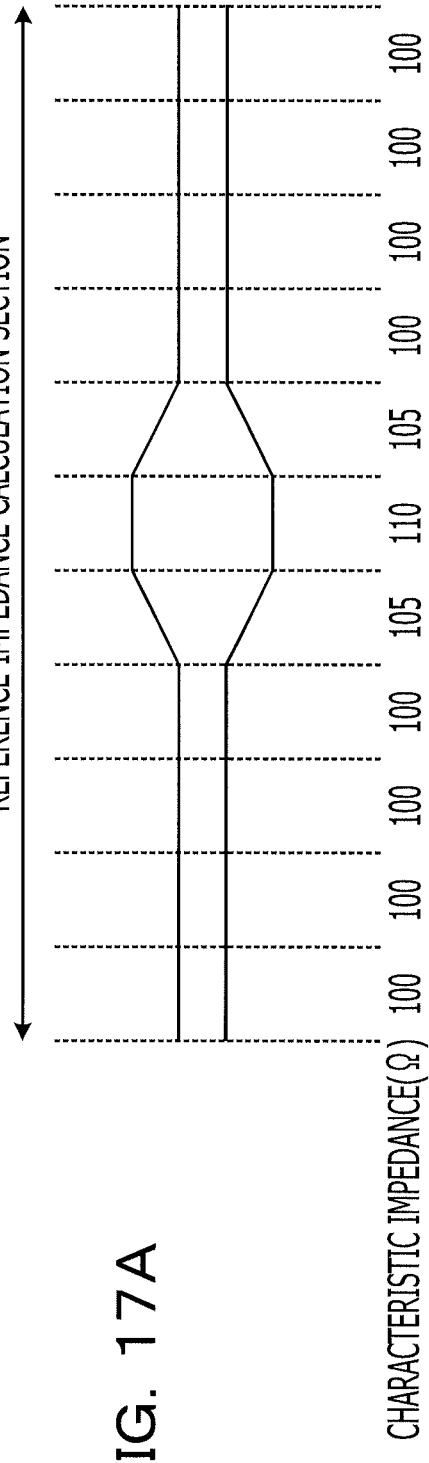
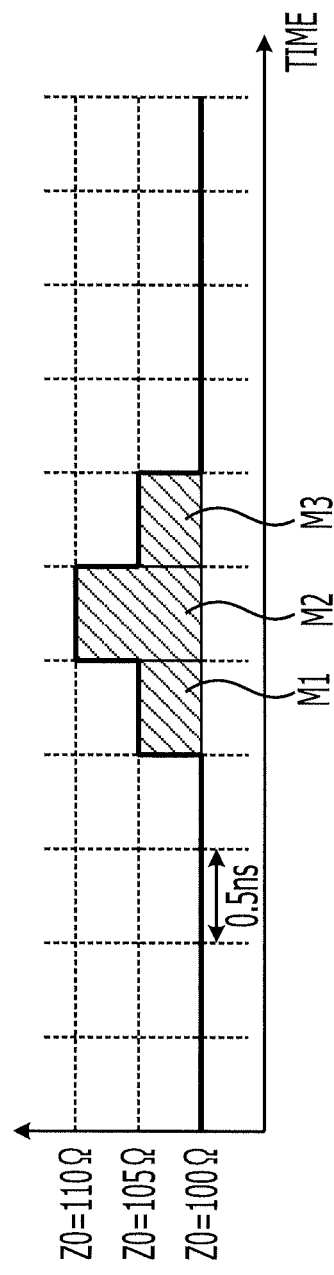
FIG. 17A
FIG. 17B

132

| NET NUMBER | WIRE LAYER | DIAMETER (mm) | CENTER COORDINATES(mm) | |
|---|---|---|---|---|
| | | | X COORDINATE | Y COORDINATE |
| 1 | L4 | 3.0 | 30 | 22.5 |
| 2 | L4 | 3.0 | 70 | 37.5 |
| 3 | L6 | 3.0 | ... | ... |
| 4 | L6 | 3.0 | ... | ... |

| No. | LAYER | ONE SIDE | BOTH SIDES | IMMEDIATELY ABOVE/BELOW | SAME LAYER / ONE LAYER HIGHER/ONE LAYER LOWER | DETERMINATION |
|---|---|---|---|---|---|---|
| - | - | 1 | 0 | 0 | 1 | GAP REGION AT ONE SIDE |
| - | - | 1 | 0 | 0 | 0 | GAP REGION AT ONE SIDE |
| - | - | 0 | 0 | 1 | 1 | NO GAP REGION |
| - | - | 1 | 0 | 0 | 1 | GAP REGION IMMEDIATELY ABOVE/BELOW |
| - | - | 1 | 1 | 0 | 0 | GAP REGION AT ONE SIDE |
| - | - | 0 | 0 | 0 | 1 | NO GAP REGION |
| - | - | 0 | 0 | 1 | 1 | GAP REGION IMMEDIATELY ABOVE/BELOW |

FIG. 26

| X COORDINATE(mm) | Y COORDINATE(mm) | PRESENCE/ABSENCE OF GAP |
|---|---|---|
| 28.5 | 20.5 | 0 |
| 28.5 | 21.0 | 1 |
| 28.5 | 21.5 | 1 |
| 29.0 | 20.5 | 0 |
| 29.0 | 21.0 | 1 |
| 29.0 | 21.5 | 1 |
| 29.5 | 20.5 | 0 |
| 29.5 | 21.0 | 1 |
| 29.5 | 21.5 | 1 |
| 30.0 | 20.5 | 0 |
| 30.0 | 21.0 | 1 |
| 30.0 | 21.5 | 1 |
| 30.5 | 20.5 | 0 |
| 30.5 | 21.0 | 1 |
| 30.5 | 21.5 | 1 |
| 31.0 | 20.5 | 0 |
| 31.0 | 21.0 | 0 |
| 31.0 | 21.5 | 1 |

FIG. 28

| No | LAYER | X COORDINATE(mm) | Y COORDINATE(mm) | CHARACTERISTIC IMPEDANCE(Ω) |
|---|---|---|---|---|
| — | — | — | — | — |
| 1 | 3 | 28.5 | 20.0 | 54 |
| 1 | 3 | 29.0 | 20.0 | 54 |
| 1 | 3 | 29.5 | 20.0 | 54 |
| 1 | 3 | 30.0 | 20.0 | 54 |
| 1 | 3 | 30.5 | 20.0 | 54 |
| 1 | 3 | 31.0 | 20.0 | 52 |
| — | — | — | — | — |
| — | — | — | — | — |

WIRE SPACING VERIFICATION METHOD, WIRE SPACING VERIFICATION APPARATUS, AND COMPUTER-READABLE MEDIUM

CROSS-REFERENCE TO RELATED APPLICATIONS

This application is based upon and claims the benefit of priority of the prior Japanese Patent Application No. 2010-80271, filed on Mar. 31, 2010, the entire contents of which are incorporated herein by reference.

FIELD

The embodiments discussed herein are related to a wire-spacing verification method, a wire-spacing verification apparatus, and a computer-readable medium.

BACKGROUND

In recent years, the amounts of information processing required for digital electronic equipment are on the rise. In order to process the large amounts of information, the transfer rate of digital signals in the electronic equipment is also increasing.

In addition, with reduced sizes of substrates and reduced profiles, the quality of the signal transmission deteriorates.

For example, increases in the densities of wires in printed circuit boards make it difficult to ensure sufficient spacing of the wires. At portions where the spacing of the wires is small, the quality of the signal transmission is deteriorated by noise.

In order to address such deterioration of the quality of the signal transmission, there is a known technology for estimating a portion where the quality of the signal transmission deteriorates. In the technology, a load (a wire parasitic load) that is parasitic in a wire model is calculated at a design stage and a portion where the wire parasitic load varies is detected.

Japanese Laid-open Patent Publication Nos. 9-44550, 5-54092, and 2002-163320 are examples of related art.

When diverse types (e.g., differential wire and single wire) of wire model to be determined and diverse types (e.g., clock and data) of signal are available, it is difficult to determine, in each wire model, sections in which characteristic impedances are to be calculated.

When three-dimensional electromagnetic analyzing software or the like is used to calculate the characteristic impedance of the wire model, there is a problem of requiring a large amount of time for computation processing.

SUMMARY

A wire-spacing verification method for a computer includes calculating a characteristic impedance of each wire model disposed in a substrate model on a basis of a propagation rate of a signal in the wire model and rise time or fall time of an element model for transmitting the signal, calculating a reference impedance for predetermined sections, creating a distribution map in a direction of a section length with respect to the characteristic impedance of each of the sections for which the reference impedance is calculated, calculating an index indicating a degree of mismatch with the reference impedance, on a basis of the created distribution map, and making an approval/denial determination on the wire model on a basis of the index.

The object and advantages of the invention will be realized and attained by at least the features, elements, and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIG. 5 illustrates the data structure of a characteristic impedance DB;

FIG. 6 illustrates a characteristic-impedance data table for a different dielectric constant;

FIG. 7 illustrates the data structure of a design DB;

FIGS. 17A and 17B illustrate calculation of a mismatch area;

FIG. 22 illustrates exemplary results of classification of positional relationships between wire models and gap regions, the classification being performed by the wire-spacing verification apparatus according to the fourth embodiment;

FIG. 26 is a table illustrating the determination results in FIG. 25;

FIG. 28 illustrates results of calculation of the characteristic impedances of the sections of the wire model, the calculation being performed by the wire-spacing verification apparatus of the fourth embodiment;

DESCRIPTION OF EMBODIMENTS

A reference model having an estimated wire parasitic load is prepared and pattern matching between layout pattern data of reference pattern data for the model and layout pattern data of input layout data is performed to calculate a wire parasitic load.

A characteristic parameter corresponding to the number of adjacent wires of wire load models obtained by modeling the loads of wires is extracted and distributed constant circuit data is output based on the characteristic parameter and the wire length of each wire load model.

A characteristic impedance of a wire model is calculated using a mathematical equation and a portion that is highly likely to affect noise is detected.

Figure 30:
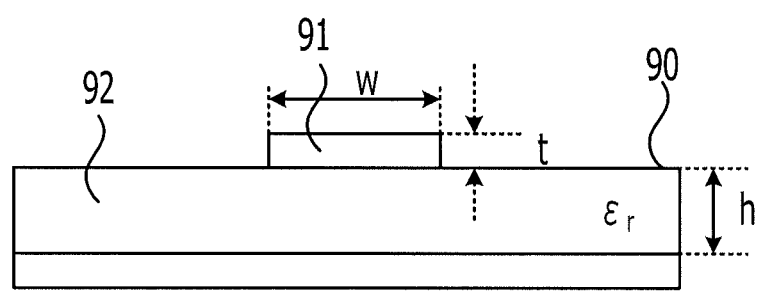
FIG. 30 illustrates an example of calculation of a characteristic impedance.

FIG. 30 illustrates an example of calculation of a characteristic impedance.

A wire model 91 is disposed on a layer 92 of a substrate model 90. Let h be the thickness of the layer 92, let ∈r be a dielectric constant of the layer 92, let t be the thickness of the wire model 91, and let w be the width of the wire model 91. A characteristic impedance Z0 can be given by equation (1) below:

$$Z0=87.0/(\in r+1.41)0.5 \ln(5.98h/(0.8w+t)) \quad (1).$$

Figure 1:
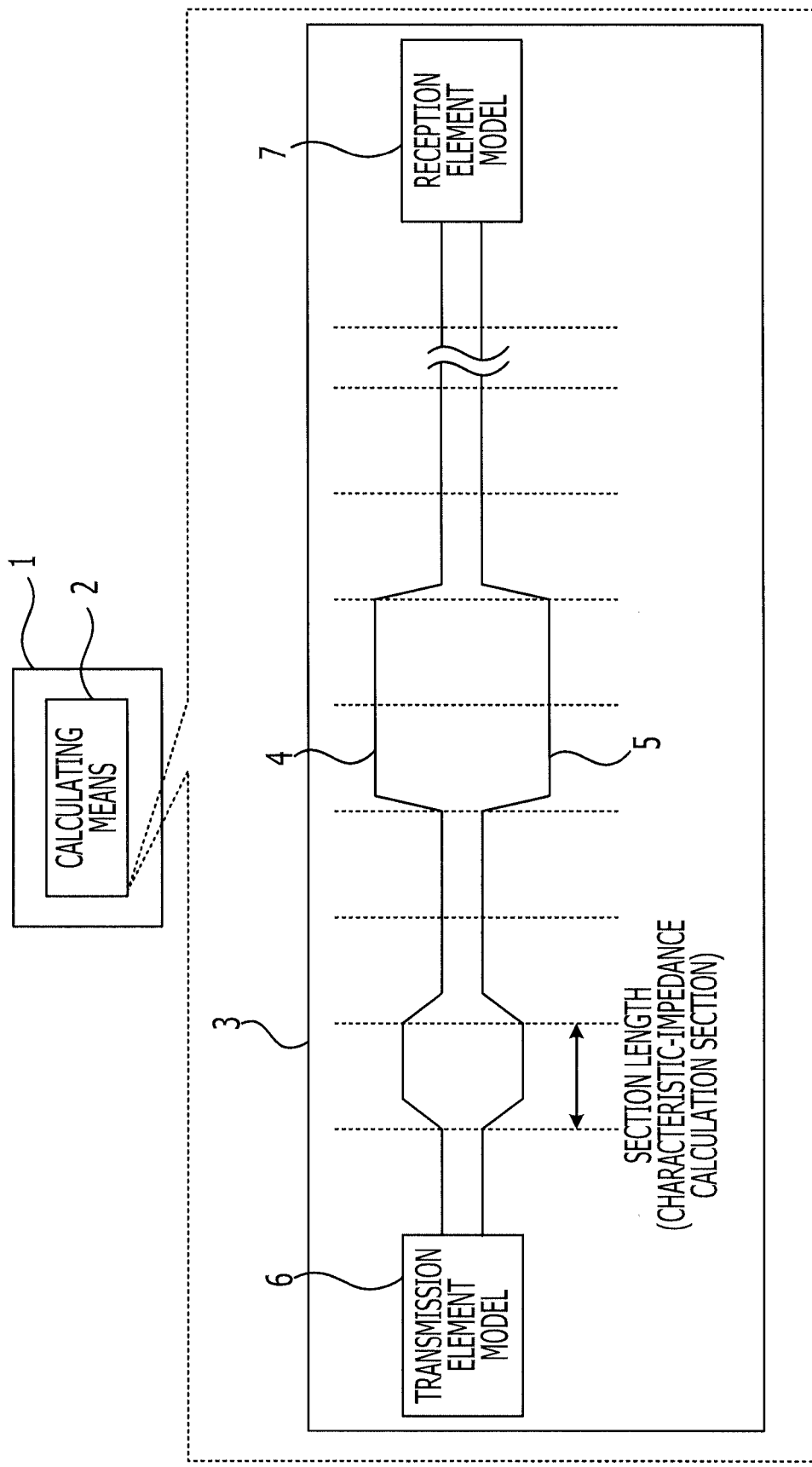
FIG. 1 illustrates an overview of a wire-spacing verification apparatus according to a first embodiment.

FIG. 1 illustrates an overview of a wire-spacing verification apparatus according to a first embodiment.

A wire-spacing verification program according to the embodiment is a program that verifies approval/denial of the spacing between wire models and that causes a wire-spacing verification apparatus (a computer) 1 to serve as calculating means 2.

FIG. 1 illustrates a configuration in which wire models 4 and 5, a transmission element model 6, and a reception element model 7 are provided on a substrate model 3. The wire models 4 and 5 transmit differential signals. The transmission element model 6 is, for example, an IC (integrated circuit) for transmitting signals. The reception element model 7 receives the differential signals, transmitted from the transmission element model 6, through the wire models 4 and 5.

The widths of the wire models 4 and 5 vary. In accordance with the variations, the characteristic impedances of the wire models 4 and 5 also vary.

On the basis of the propagation rates of signals propagated by the wire models 4 and 5 and the rise time (tr) or fall time (tf) of the transmission element model 6, the calculating means 2 sets a section length of a section in which the characteristic impedances of the wire models 4 and 5 are calculated.

For example, the section length is expressed by:

$$\text{Section Length} = (\text{Propagation Rate} \times trtf)/\text{Division Coefficient} \quad (2).$$

where trtf indicates one of the rise time or the fall time.

When the rise time and the fall time are different from each other, it is preferable to use the smaller value of the times.

It is also preferable that the division coefficient be set so that the amplitude of a reflection wave in sections divided to have a section length is smaller than or equal to 0.1 times the amplitude of an incoming wave within the time of the trtf. With this arrangement, it is possible to reduce the influence of noise on signals propagated by the wire models 4 and 5. The value "0.1 times" is exemplary and it goes without saying that the value is not limited thereto. The division coefficient may be determined by a user who operates the wire-spacing verification apparatus 1 or may be determined by a predetermined equation.

A threshold as to whether or not a mismatch of the characteristic impedances of actual wires affects the signal quality varies depending on the trtf. When the value of the trtf is small, there is a possibility that the differential signals contain a large amount of high-frequency component. The higher the frequency of a signal, the shorter the wavelength of the signal is. Even for a mismatch of characteristic impedances at a short distance, a signal having a short wavelength deteriorates the quality of the waveform since the physical length of the high-frequency components of the signal becomes a considerable length relative to the wavelength. Hence, calculation of the section length by using equation (2) makes it possible to set the section length to be small when the trtf is small. Thus, it is possible to perform modeling for finer units. Thus, it is possible to improve the reliability of approval/denial of the wire models. Since the section length is adapted to be set based on the propagation rate and the trtf, the section length can be easily determined.

Applying the section length, determined using equation (2), to a process described below makes it possible to easily verify the approval/denial of the wire models.

Processing executed by the wire-spacing verification apparatus 1 of the present embodiment is applicable to a design routine check (DRC) process for wires models disposed on a printed circuit board. The embodiment will be described below in more detail.

A description in a second embodiment will be given of one example of a method in which two adjacent signals constitute differential signals and a differential impedance thereof is calculated.

Figure 2:
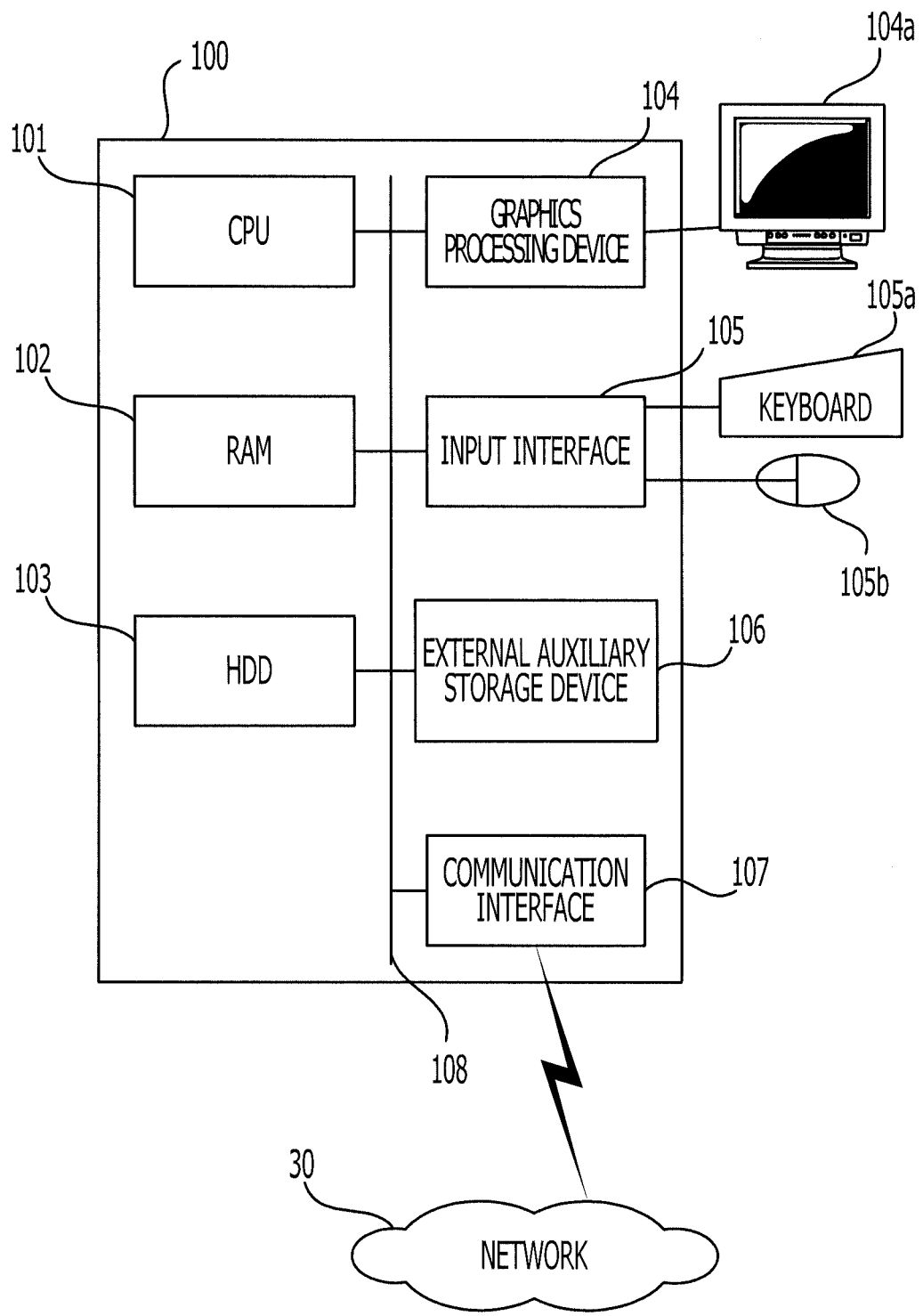
FIG. 2 illustrates the hardware configuration of a wire-spacing verification apparatus according to a second embodiment.

FIG. 2 is a diagram illustrating an example of the hardware configuration of a wire-spacing verification apparatus according to the second embodiment.

A wire-spacing verification apparatus 100 has a CPU (central processing unit) 101, which controls the entire apparatus. A RAM (random access memory) 102, a hard disk drive (HDD) 103, a graphics processing device 104, an input interface 105, an external auxiliary storage device 106, and a communication interface 107 are coupled to the CPU 101 through a bus 108.

The RAM 102 temporarily stores at least part of an OS (operating system) program and application programs to be executed by the CPU 101. The RAM 102 stores various types of data needed for processing to be executed by the CPU 101. The OS and application programs are stored in the HDD 103. Program files are also stored in the HDD 103.

A monitor 104a is coupled to the graphics processing device 104. In accordance with an instruction from the CPU 101, the graphics processing device 104 displays an image on a screen of the monitor 104a. A keyboard 105a and a mouse 105b are coupled to the input interface 105. The input interface 105 sends signals, input from the keyboard 105a and the mouse 105b, to the CPU 101 through the bus 108.

The external auxiliary storage device 106 reads information written on a recording medium and/or writes information to the recording medium. Examples of the recording medium that is readable/writable by the external auxiliary storage device 106 include a magnetic recording device, an optical disk, a magneto optical recording medium, and a semiconductor memory. Examples of the magnetic recording device include a HDD, a flexible disk (FD), and a magnetic tape. Examples of the optical disk include a DVD (Digital Versatile Disc), a DVD-RAM (Random Access Memory), a CD-ROM (Compact Disc-Read Only Memory), and a CD-R (Recordable)/RW (ReWritable). One example of the magneto optical recording medium is an MO (magneto-optical disk).

The communication interface 107 is linked to a network 30. The communication interface 107 transmits/receives data to/from another computer over the network 30.

A hardware configuration as described above can realize processing functions in the present embodiment. The wire-spacing verification apparatus 100 having such a hardware configuration has functions described below.

Figure 3:
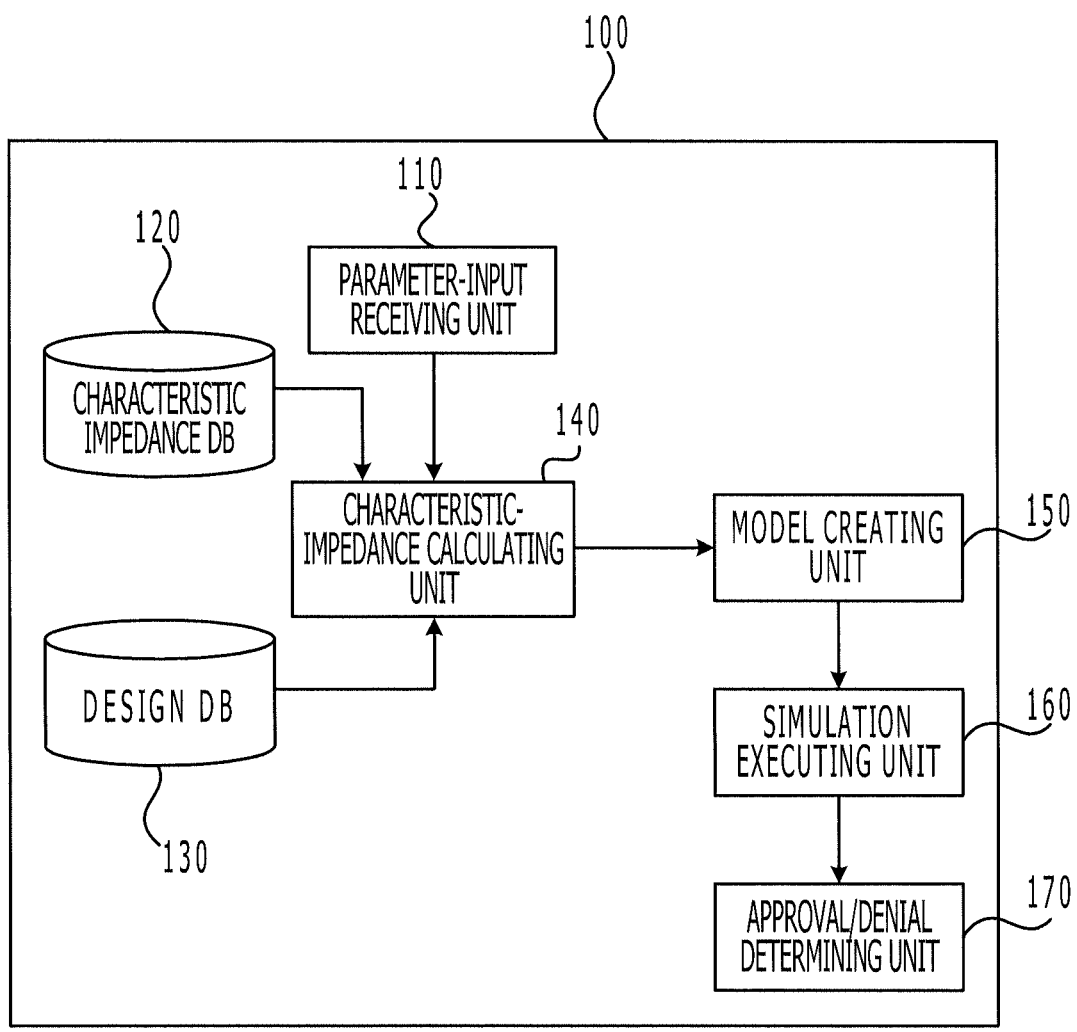
FIG. 3 is a block diagram of the wire-spacing verification apparatus according to the second embodiment.

FIG. 3 is a block diagram illustrating functions of the wire-spacing verification apparatus according to the second embodiment. The wire-spacing verification apparatus 100 includes a parameter-input receiving unit 110, a characteristic impedance DB (database) 120, a design DB 130, a characteristic-impedance calculating unit 140, a model creating unit 150, a simulation executing unit 160, and an approval/denial determining unit 170.

The characteristic impedance DB 120 and the design DB 130 may be realized by an area of the HDD 103. The parameter-input receiving unit 110, the characteristic-impedance calculating unit 140, the model creating unit 150, the simulation executing unit 160, and the approval/denial determining unit 170 may be realized by a function of the CPU 101.

The parameter-input receiving unit 110 displays a selected screen (described below) on the monitor 104a. Target nets whose section length is calculated are specified on the basis of conditions input via the keyboard 105a and/or the mouse 105b. Examples of the conditions include the type (attribute information) of signal transmitted through a wire model, a width-direction range in which the amount of change in the characteristic impedance is to be calculated, and a threshold of the characteristic impedance during extraction for ranking. The parameter-input receiving unit 110 receives various other conditions input thereto.

Data in which numeric values indicating relationships of a wire spacing, a wire width, a layer pitch, and a characteristic impedance of each wire model are listed with respect to a plurality of conditions are stored in the characteristic impedance DB 120. Design data regarding wires to be verified are stored in the design DB 130.

Figure 4:
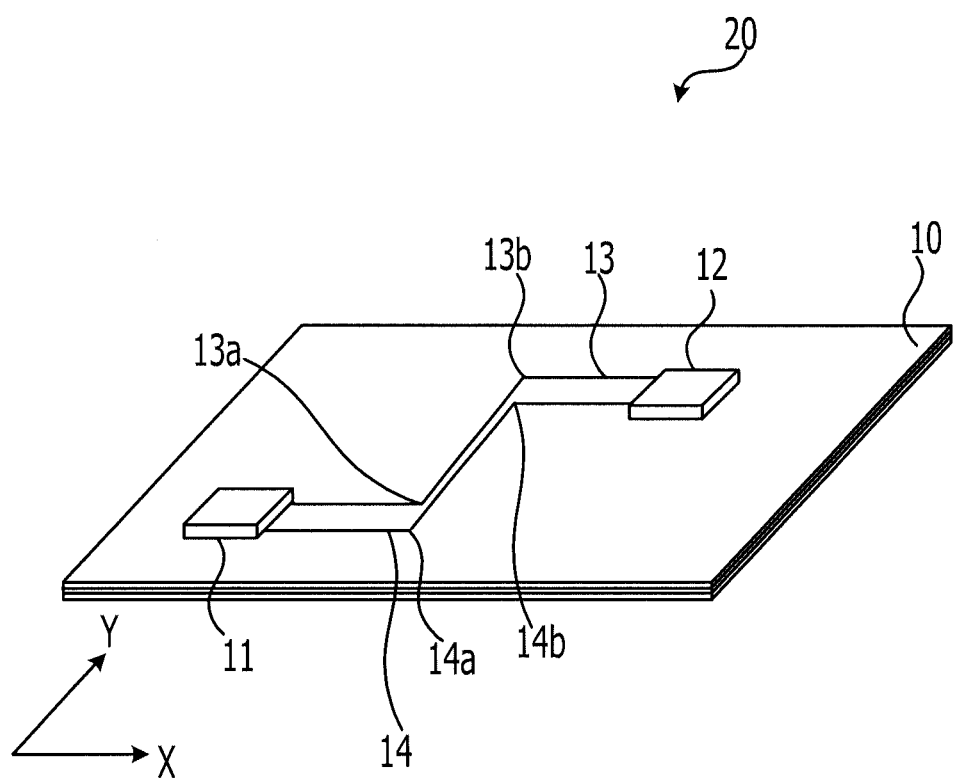
FIG. 4 illustrates the structure of a circuit model to be verified.

FIG. 4 is a perspective view of the structure of a circuit model to be verified. In a circuit model 20 illustrated in FIG. 4, wire models 13 and 14 are formed in an uppermost dielectric layer of a substrate model 10 having stacked dielectric layers. The wire models 13 and 14 transmit differential signals, generated by a transmission element model 11, to a reception element model 12. Each dielectric layer may be a core element or an adhesive layer.

The wire models 13 and 14 have patterns of wires or predetermined shapes for transmitting signals. The wire model 13 has bending portions 13a and 13b that bend at about 90°. The wire model 14 has bending portions 14a and 14b that bend at about 90°.

The gap between a portion between the bending portions 13a and 13b of the wire model 13 and a portion between the bending portions 14a and 14b of the wire model 14 is smaller than the gap between the other portions of the wire models 13 and 14.

In the substrate model 10, a layer in which the wire models 13 and 14 used as signal lines or the like are formed and a layer in which a solid-conductor model (not illustrated) is formed are alternately stacked.

The solid-conductor model is formed in a plane to provide a pattern that is held at ground potential and that serves as a return path of transmission signals. Thus, it is preferable to design the wire models 13 and 14 and the solid-conductor model so that the signal characteristics of the wire models 13 and 14 become satisfactory (typically, so that the matching of the characteristic impedances is achieved (e.g., 50Ω)). The solid-conductor model may be held at a predetermined positive or negative potential. Coordinates in an X-axis direction and a Y-axis direction which are illustrated in FIG. 4 are described below.

Now, a description will be given with reference back to FIG. 3. By using information extracted from the design DB 130 as input conditions and on the basis of information stored in the characteristic impedance DB 120, the characteristic-impedance calculating unit 140 calculates a characteristic impedance of two adjacent wire models for the target nets specified by the parameter-input receiving unit 110. More specifically, the characteristic-impedance calculating unit 140 sets a section length that servers as a unit of a section in which the characteristic impedance is to be calculated. One section sectioned by the set wire-model section length is set as a characteristic-impedance calculation section. The characteristic-impedance calculating unit 140 then calculates a characteristic impedance of each characteristic-impedance calculation section. The characteristic-impedance calculating unit 140 may have a function for storing the calculated characteristic impedances of the corresponding characteristic-impedance calculation sections.

The model creating unit 150 creates a simulation model. More specifically, the model creating unit 150 creates a transmission-path model corresponding to the characteristic impedances of the characteristic-impedance calculation sections, the characteristic impedances being calculated by the characteristic-impedance calculating unit 140. The model creating unit 150 then couples a transmission element model at a signal transmission side of the wire models and the transmission-path model. The model creating unit 150 also couples a reception element model at a signal reception side of the wire models and the transmission-path model. The resulting structure serves as a simulation model.

In this case, it is preferable that a library (a transmission-path library) containing a plurality of transmission paths having characteristic impedances, each having a certain range and a certain step value, be prepared, so as to allow the model creating unit 150 to create a simulation model by retrieving the transmission paths corresponding to the calculated characteristic impedances. The library may be provided in the wire-spacing verification apparatus 100 or may be provided outside the wire-spacing verification apparatus 100.

The simulation executing unit 160 executes waveform simulation on the simulation model created by the model creating unit 150. As a result of the execution of the simulation, an eye-pattern waveform is obtained.

The approval/denial determining unit 170 applies a mask, which is based on a receiving-element standard, to the eye-pattern waveform obtained by the simulation executing unit 160 and checks whether or not the eye-pattern waveform interrupts the mask, to thereby determine the approval/denial of the wire spacing relevant to the quality of the wiring design. The approval/denial determining unit 170 may have a function for displaying the eye-pattern waveform and the mask on the monitor 104a.

Next, a description will be given of information stored in the DBs of the wire-spacing verification apparatus 100. FIG. 5 illustrates the data structure of the characteristic impedance DB. Tabularized information is stored in the characteristic impedance DB 120.

A characteristic-impedance data table 121 has columns of the input conditions and the calculation result. Pieces of information that are horizontally arranged are associated with each other.

The column "input condition" has items indicating conditions input by the user. Specifically, the column "input condition" has items "dielectric constant", "layer pitch (mm)", "wire width (mm)", and "wire spacing (mm)". Prepared values are preset for these items.

The characteristic-impedance data table 121 illustrated in FIG. 5 is an example when the dielectric constant is 3.8. Patterns when the layer pitch increases from 0.2 mm in increments of 0.1 mm, the wire width increases from 0.1 mm in increments of 0.05 mm, and the wire spacings are 0.3 mm, 0.4 mm, and 0.5 mm are set with respect to a dielectric constant of 3.8.

Characteristic impedances determined based on the input conditions are preset in the column "calculation result". A plurality of the characteristic-impedance data tables 121 are set for corresponding dielectric constants that are input.

FIG. 6 illustrates a characteristic impedance data table for a different dielectric constant. The characteristic-impedance data table 121 illustrated in FIG. 6 is an example when the dielectric constant is 4.3. The provision of such characteristic-impedance data tables 121 makes it possible to reduce the computation time.

FIG. 7 illustrates the data structure of a design DB. Tabularized information is stored in the design DB 130. A design data table 131 has columns of a net number, pair recognition, wire layer, dielectric constant, layer pitch (mm), wire width (mm), wire spacing (mm), start point (mm), and end point (mm). Pieces of information that are horizontally arranged are associated with each other.

As described above, the design data table 131 indicates data for a multilayer-substrate model. The substrate model has wire layers having wire patterns and ground layers having potential held at ground potential. The wire layers are sandwiched between the ground layers.

In the column "net number", information for identifying the wire models is set. In the column "pair recognition", information for identifying wire-model pairs each transmitting differential signals is set. For example, 1Posi and 1Nega constitute a wire-model pair and 2Posi and 2Nega constitute a wire-model pair. In the column "wire layer", information for identifying, in the substrate model, layers in which the corresponding wire-model pairs exist is set. In the column "dielectric constant", dielectric constants of the wire models are set. In the column "layer pitch (mm)", values indicating the pitch of ground layers that sandwich the layers in which the wire models are disposed are set. In the column "wire width (mm), values indicating the widths of the wire models (the widths correspond to the width w illustrated in FIG. 30) are set. In the column "wire spacing (mm)", a value indicating a smallest distance between the wire models of each pair is set.

Each of the columns "start point (mm)" and "end point (mm)" is further divided into a column "X coordinate" and a column "Y coordinate". The X coordinate and the Y coordinate represent coordinates, for example, when a lower left vertex of the substrate model 10 illustrated in FIG. 4 is set as a reference (0, 0) and sides extending from the vertex to other vertices are represented by an X axis and a Y axis.

In the column "X coordinate" of the "start point", the X coordinate of the start point of each wire model is set. In the column "Y coordinate" of the "start point", the Y coordinate of the start point of the wire model is set. In the column "X coordinate" of the "end point", the X coordinate of the end point of each wire model is set. In the column "Y coordinate" of the "end point", the Y coordinate of the end point of the wire model is set.

Figure 8:
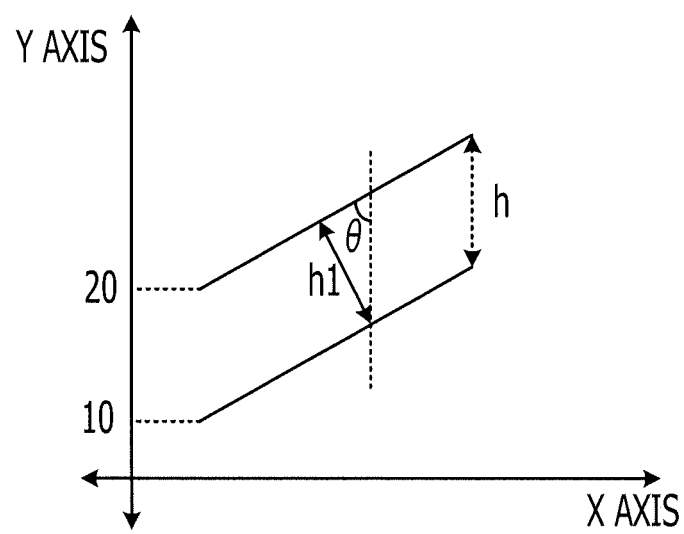
FIG. 8 illustrates a method for calculating a wire spacing.

The wire spacing is calculated in a manner described below. FIG. 8 illustrates one example of a method for calculating the wire spacing. A description will be given in conjunction with an example of calculating a wire spacing h1 between the wire model with net number 1 and the wire model with net number 2.

A wire spacing h in the Y-axis direction is first determined by:
"Wire Spacing h In Y-axis Direction"="Y-axis Coordinate of Start Point of Wire Posi"−"Y-axis Coordinate of Start Point of Wire Nega"=|10 (mm)−20 (mm)|=10 (mm).

An angle θ made by the wire line and the Y axis is determined next. Angle θ made by Wire Line and Y Axis=tanˆ−1 ("Increase in X-axis Direction"/"Increase in Y-axis Direction")=tanˆ−1 ((20−10)/(100/10))=0.11 (rad)

A wire spacing h1 is determined next. Wire Spacing h1=Wire Spacing In Y-axis Direction×sin(Angle made by Wire and Y Axis)=10 (mm)×sin(0.11)=1.1 (mm).

Figure 9:
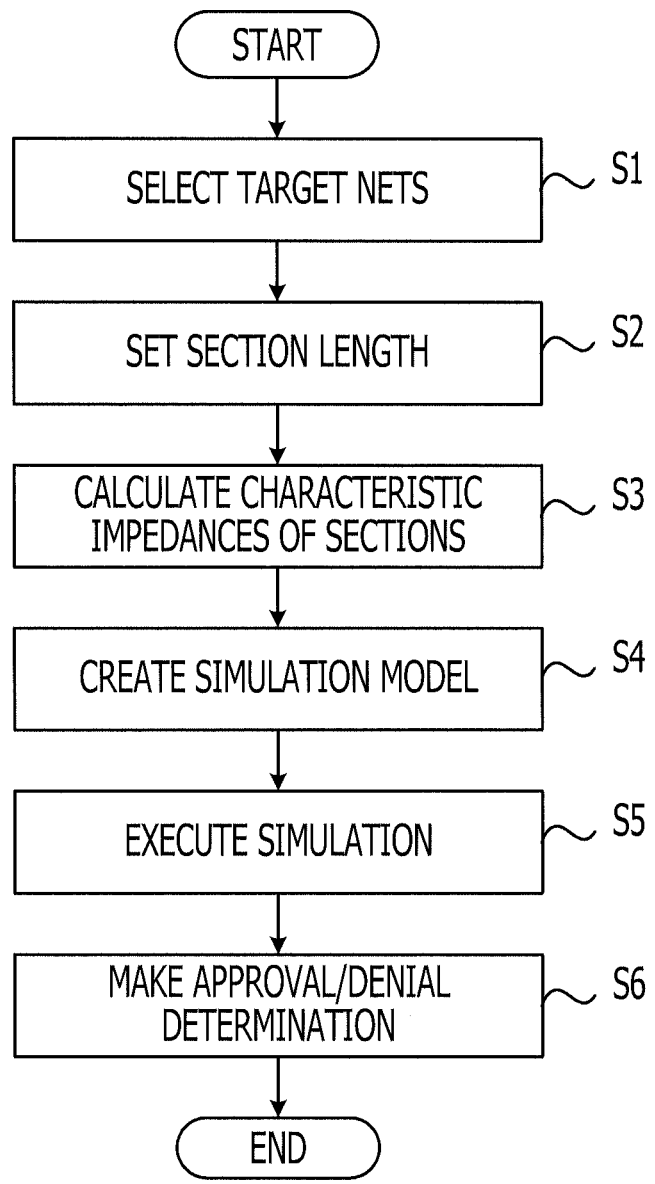
FIG. 9 illustrates overall processing of the wire-spacing verification apparatus according to the second embodiment.

A flow of processing of the wire-spacing verification apparatus 100 will be described next. FIG. 9 is a flowchart illustrating overall processing of the wire-spacing verification apparatus according to the second embodiment. In operation S1, the parameter-input receiving unit 110 receives selected target nets. Thereafter, the process proceeds to operation S2.

In operation S2, the characteristic-impedance calculating unit 140 sets a section length of wire models. Thereafter, the process proceeds to operation S3. In operation S3, the characteristic-impedance calculating unit 140 refers to the design data table 131 to extract the wire spacings, wire widths, layer pitches, and dielectric constants with respect to the characteristic-impedance calculation sections sectioned by the section length. By using the extracted information as input conditions, the characteristic-impedance calculating unit 140 performs approximation on the basis of the contents of the characteristic-impedance data table 121 to thereby calculate characteristic impedances of the sections. Thereafter, the process proceeds to operation S4. The approximation is described below.

In operation S4, the model creating unit 150 creates a simulation model on the basis of the characteristic impedances calculated by the characteristic-impedance calculating unit 140. Thereafter, the process proceeds to operation S5. In operation S5, the simulation executing unit 160 executes simulation on the simulation model created by the model creating unit 150. As a result of the execution of the simulation, an eye-pattern waveform is obtained. Thereafter, the process proceeds to operation S6. In operation S6, the approval/denial determining unit 170 makes an approval/denial determination by applying a mask to the created eye-pattern waveform. The description of the overall processing of the wire-spacing verification apparatus 100 is finished at this point.

Next, a description will be given of the approximation described in operation S3. The approximation is realized by a scheme for selecting, as appropriate values, values corresponding to condition values that are included in a characteristic-impedance database and that are the closest to the target values with respect to the parameters of the physical dimensions and the dielectric constant.

Figure 10:
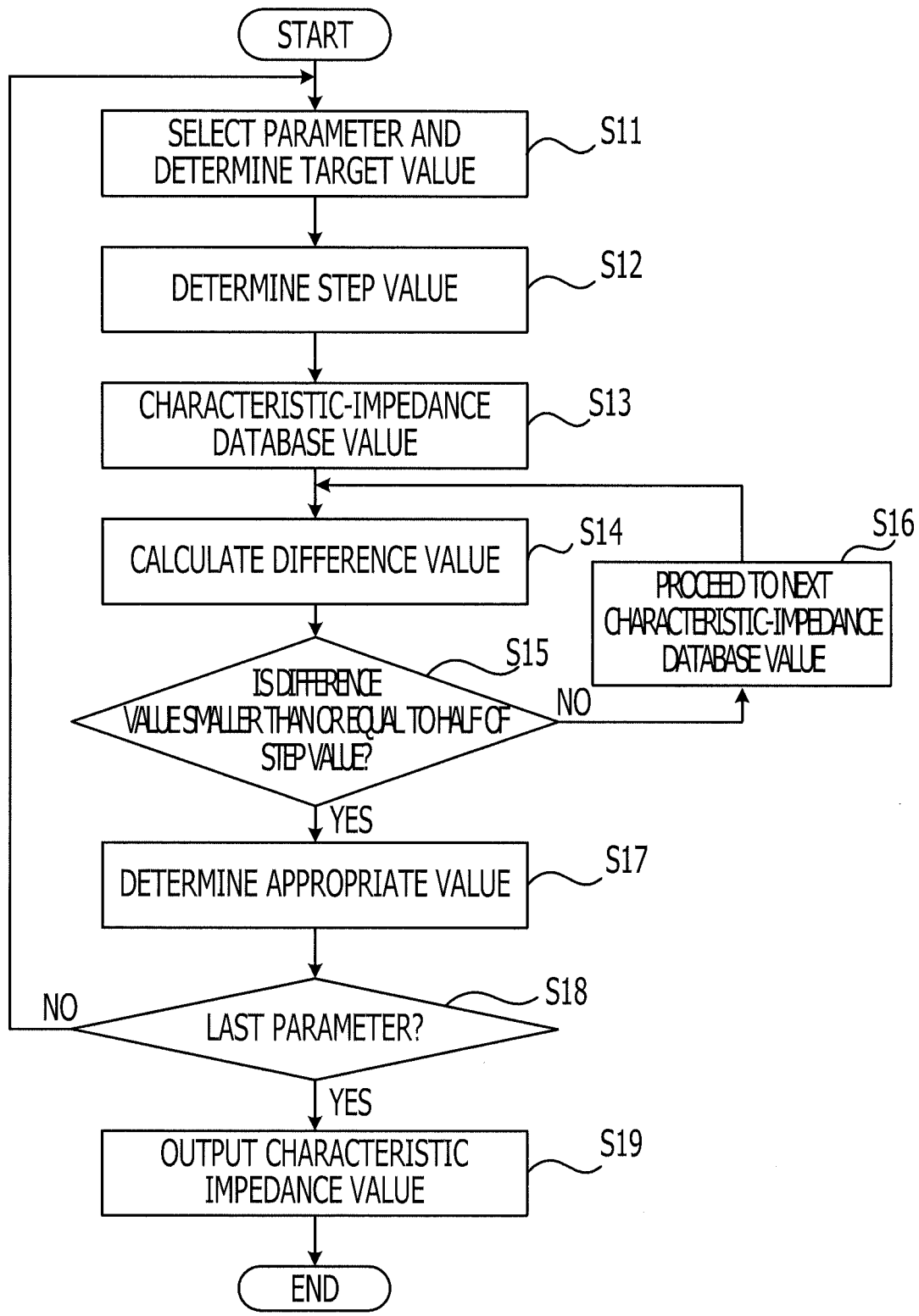
FIG. 10 illustrates approximation processing.

FIG. 10 is a flowchart illustrating approximation processing. In operation S11, the characteristic-impedance calculating unit 140 selects one of parameters extracted from the design data table 131. The characteristic-impedance calculating unit 140 then sets the value of the selected parameter as a target value". Thereafter, the process proceeds to operation S12.

In operation S12, the characteristic-impedance calculating unit 140 recognizes the step size between the characteristic-impedance data tables 121 with respect to the parameter selected in operation S11, and sets the step size as a "step value". Thereafter, the process proceeds to operation S13. In operation S13, the characteristic-impedance calculating unit 140 determines an initial value of the parameter included in the characteristic-impedance data table 121 and selected in operation S11. The characteristic-impedance calculating unit 140 sets the determined initial value as a "characteristic-impedance database value". Thereafter, the process proceeds to operation S14.

In operation S14, the characteristic-impedance calculating unit 140 calculates the absolute value of the "characteristic-impedance database value"−"target value" and sets the determined absolute value as a difference value. Thereafter, the process proceeds to operation S15. In operation S15, the characteristic-impedance calculating unit 140 judges whether or not the difference value is smaller than or equal to a half of the step value. When the difference value is not smaller than or equal to the half of the step value (No in operation S15), the process proceeds to operation S16. When the difference value is smaller than or equal to the half of the step value (Yes in operation S15), the process proceeds to operation S17.

In operation S16, the characteristic-impedance calculating unit 140 selects the value of the parameter in the next characteristic-impedance data table 121. Thereafter, the process proceeds to operation S17. In operation S17, the characteristic-impedance calculating unit 140 determines, as an appropriate value, the characteristic-impedance database value at this point. Thereafter, the process proceeds to operation S18.

In operation S18, the characteristic-impedance calculating unit 140 judges whether or not the parameter is a last parameter. When the parameter is not a last parameter (No in operation S18), the process proceeds to operation S11 and the processing therein and the subsequent operations is repeatedly performed. When the parameter is a last parameter (Yes in operation S18), the process proceeds to operation S19.

In operation S19, the characteristic-impedance calculating unit 140 outputs, as a calculation result, the corresponding characteristic-impedance database value. Thereafter, the approximation processing ends. The description of the approximation processing is finished at this point.

Next, a description will be given of a specific example of processing performed by the wire-spacing verification apparatus 100.

<Selection of Target Net to be Verified>

Figure 11:
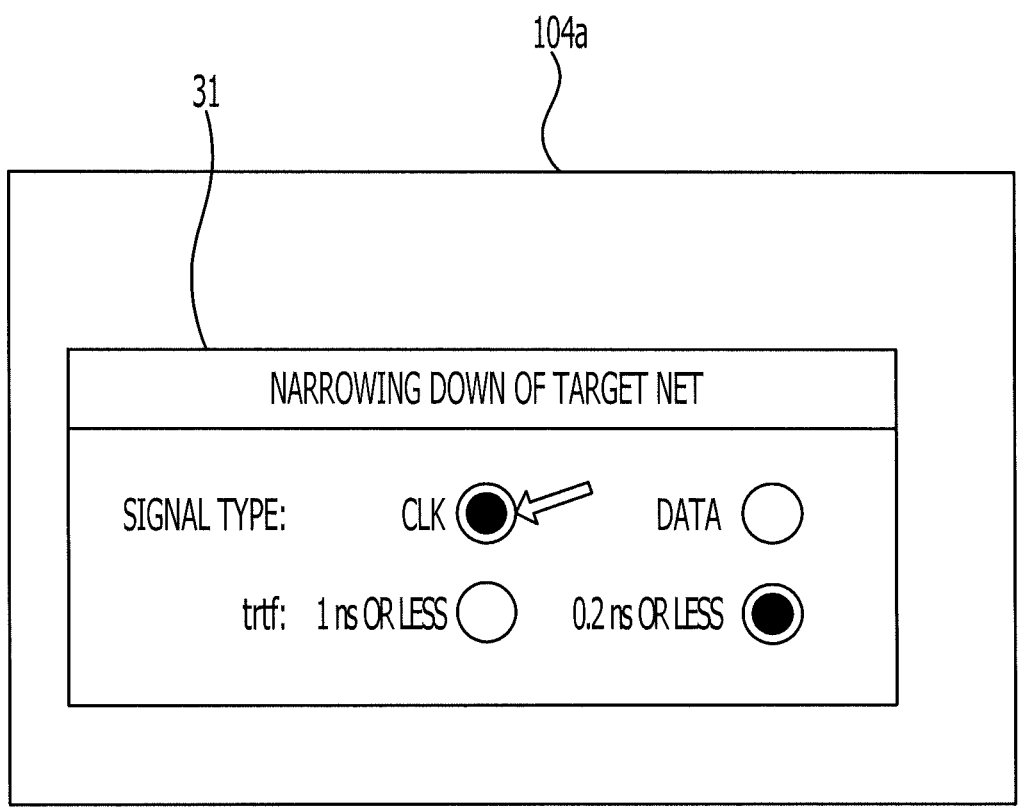
FIG. 11 illustration selection of target nets.

FIG. 11 illustrates selection of a net to be verified. The user may randomly select one of substrate nets (not illustrated) as a net to be verified. In FIG. 11, a selection screen 31 for narrowing down target nets to be verified is displayed on the monitor 104a. A signal type and the trtf are displayed on the selection screen 31 as parameters. By using the keyboard and/or the mouse, the user may select one of attributes "CLK" and "DATA" for the signal type. The user may also select one of attributes "1 ns or less" and "0.2 ns or less" for the trtf. Moreover, the user may narrow down the target nets to be verified, by selecting a portion where a waveform deterioration is in question (e.g., a portion where the transmission rate is about 100 Mbps).

<Setting of Section Length>

The section length is set using equation (2) described above in the first embodiment. Equation (2) is indicated below again:

$$\text{Section Length} = (\text{"Propagation Rate of Transmission Path"} \times trtf)/\text{Division Coefficient} \quad (2).$$

In the present embodiment, for example, the division coefficient is set so that the amplitude of a reflection wave in the sections after the division is 0.1 times the amplitude of an incoming wave within the time of the trtf. The division coefficient can be expressed by equation (3) below:

$$\text{Division Coefficient} = \log 0.1 \quad (3),$$

where the base of log is a reflection coefficient. Equation (3) is a modification of "Reflection Coefficient"^"Division Coefficient"=0.1.

The reflection coefficient can be expressed by equation (4) below:

$$\text{Reflection Coefficient} = ((\text{Reference Impedance } (\Omega) \pm \text{Maximum Mismatch Degree } (\Omega) - \text{Reference Impedance}/((\text{Reference Impedance } ((\Omega)) (\text{Maximum Mismatch Degree } ((\Omega)) + \text{Reference Impedance}) \quad (4),$$

where the reference impedance has a predetermine value (e.g., 50(Ω) and the maximum mismatch degree represents an amount by which a difference from the reference impedance is permitted. The value of the maximum mismatch degree may be predetermined. For example, when the reference impedance is 50 (the maximum mismatch degree may be set to about 5 (about 10%)). The section length can be set in accordance with equation (4) noted above.

<Determination of Characteristic Impedance of Characteristic-Impedance Calculation Section>

The characteristic-impedance calculating unit 140 refers to the design data table 131 to extract a wire spacing, a wire width, a layer pitch, and a dielectric constant with respect to each characteristic-impedance calculation section sectioned by the section length. The characteristic-impedance calculating unit 140 refers to the characteristic-impedance data table 121 by using the information as input conditions and performs approximation to calculate a characteristic impedance of each section. One example of the approximation will be described below.

<Approximation>

As described above, the characteristic-impedance calculating unit 140 achieves the approximation by using a scheme for selecting, as appropriate values, values corresponding to condition values that are included in the characteristic-impedance data tables 121 and that are the closest to the target values with respect to the parameters of the physical dimensions and the dielectric constant.

A case in which the characteristic-impedance calculating unit 140 extracts, as parameters, a dielectric constant "4.2", a layer pitch "0.31 (mm)", a wire width "0.16 (mm)", and a wire spacing "0.48 (mm)" from the design data table 131 will be described below by way of example.

First, the dielectric constant is selected. Subsequently, the dielectric-constant value "4.2" extracted from the design data table 131 is determined as a target value. When the characteristic-impedance data tables 121 are referred to, the step size of the dielectric constants in the characteristic-impedance data tables 121 is 0.5 (=4.3−3.8). Thus, the step value is set to 0.5. The initial value of the characteristic-impedance database value is set to the smaller one of the dielectric constants, i.e., to 3.8.

Under the conditions, the difference value is given by |"Characteristic Impedance Database Value"–"Target Value"|=|3.8−4.2|=0.4. The half of the step value is given by "Step Value"/2=0.5/2=0.25.

In this case, since the difference value "0.4" is not smaller than or equal to the half (0.25) of the step value, the dielectric-constant value "4.3" in the next characteristic-impedance data table 121 is selected as the characteristic-impedance database value.

The difference value is given by |"Characteristic Impedance Database Value"–"Target Value"|=|4.3−4.2|=0.1. In this case, since the difference value "0.1" is smaller than or equal to the half (0.25) of the step value, 4.3 is set as an appropriate value.

Since the dielectric constant is not a last parameter, the layer pitch is selected as a next parameter. Subsequently, the layer-pitch value "0.31" extracted from the design data table 131 is determined as a target value. When the characteristic-impedance data tables 121 are referred to, the step size of the layer pitches in the characteristic-impedance data tables 121 is 0.1 mm. Thus, the step value is set to 0.1. The initial value of the characteristic-impedance database value is set to the smallest layer pitch "0.2". Under the conditions, the difference value is given by |"Characteristic Impedance Database Value"–"Target Value"|=|0.1|0.31|=0.21. The half of the step value is given by "Step Value"/2=0.1/2=0.05.

In this case, since the difference value "0.21" is not smaller than or equal to the half (0.05) of the step value, the layer-pitch value "0.3" in the next characteristic-impedance data table 121 is selected as a characteristic-impedance database value.

The difference value is given by |"Characteristic Impedance Database Value"–"Target Value"|=|0.3−0.31|=0.01. In this case, since the difference value "0.01" is smaller than or equal to the half (0.05) of the step value, 0.3 mm is set as an appropriate value.

Since the layer pitch is not the last parameter, the wire width is selected as a next parameter. Subsequently, the wire-width value "0.16" extracted from the design data table 131 is determined as a target value. When the characteristic-impedance data tables 121 are referred to, the step size of the wire widths in the characteristic-impedance data tables 121 is 0.05 mm. Thus, the step value is set to 0.05. The initial value of the characteristic-impedance database value is set to the smallest wire width "0.1".

Under the conditions, the difference value is given by |"Characteristic Impedance Database Value"–"Target Value"|=|0.1−0.16|=0.06. The half of the step value is given by "Step Value"/2=0.05/2=0.025.

In this case, since the difference value "0.06" is not smaller than or equal to the half (0.025) of the step value, the wire-width value "0.15" in the next characteristic-impedance data table 121 is selected as the characteristic-impedance database value.

The difference value is given by |"Characteristic Impedance Database Value"–"Target Value"|=|0.15−0.16|=0.01. In this case, since the difference value "0.01" is smaller than or equal to the half (0.025) of the step value, 0.15 mm is set as an appropriate value.

Since the wire width is not the last parameter, the wire spacing is selected as a next parameter. Subsequently, the wire-spacing value "0.48" extracted from the design data table 131 is determined as a target value. When the characteristic-impedance data tables 121 are referred to, the step size of the wire spacings in the characteristic-impedance data tables 121 is 0.1 mm. Thus, the step value is set to 0.1. The initial value of the characteristic-impedance database value is set to the smallest wire spacing "0.3".

Under the conditions, the difference value is given by |"Characteristic Impedance Database Value"–"Target Value"|=|0.3−0.48|=0.16. The half of the step value is given by "Step Value"/2=0.1/2=0.05. In this case, since the difference value "0.16" is not smaller than or equal to the half (0.05) of the step value, the wire-spacing value "0.4" in the next characteristic-impedance data table 121 is selected as the characteristic-impedance database value.

The difference value is given by |"Characteristic Impedance Database Value"–"Target Value"|=|0.4−0.48|=0.08. In this case, since the difference value "0.08" is not smaller than or equal to the half (0.05) of the step value, the wire-spacing value "0.5" in the next characteristic-impedance data table 121 is selected as the characteristic-impedance database value.

The difference value is given by |"Characteristic Impedance Database Value"–"Target Value"|=|0.5−0.48|=0.02. In this case, since the difference value "0.02" is smaller than or equal to the half (0.05) of the step value, 0.5 mm is set as an appropriate value. Since the wire spacing is the last parameter, a characteristic impedance "94.8Ω" corresponding to the dielectric constant "4.3", the layer pitch "0.3", the wire width "0.15", and the wire spacing "0.5" is extracted with reference to the characteristic-impedance data tables 121.

<Creation of Simulation Model>

Figure 12:
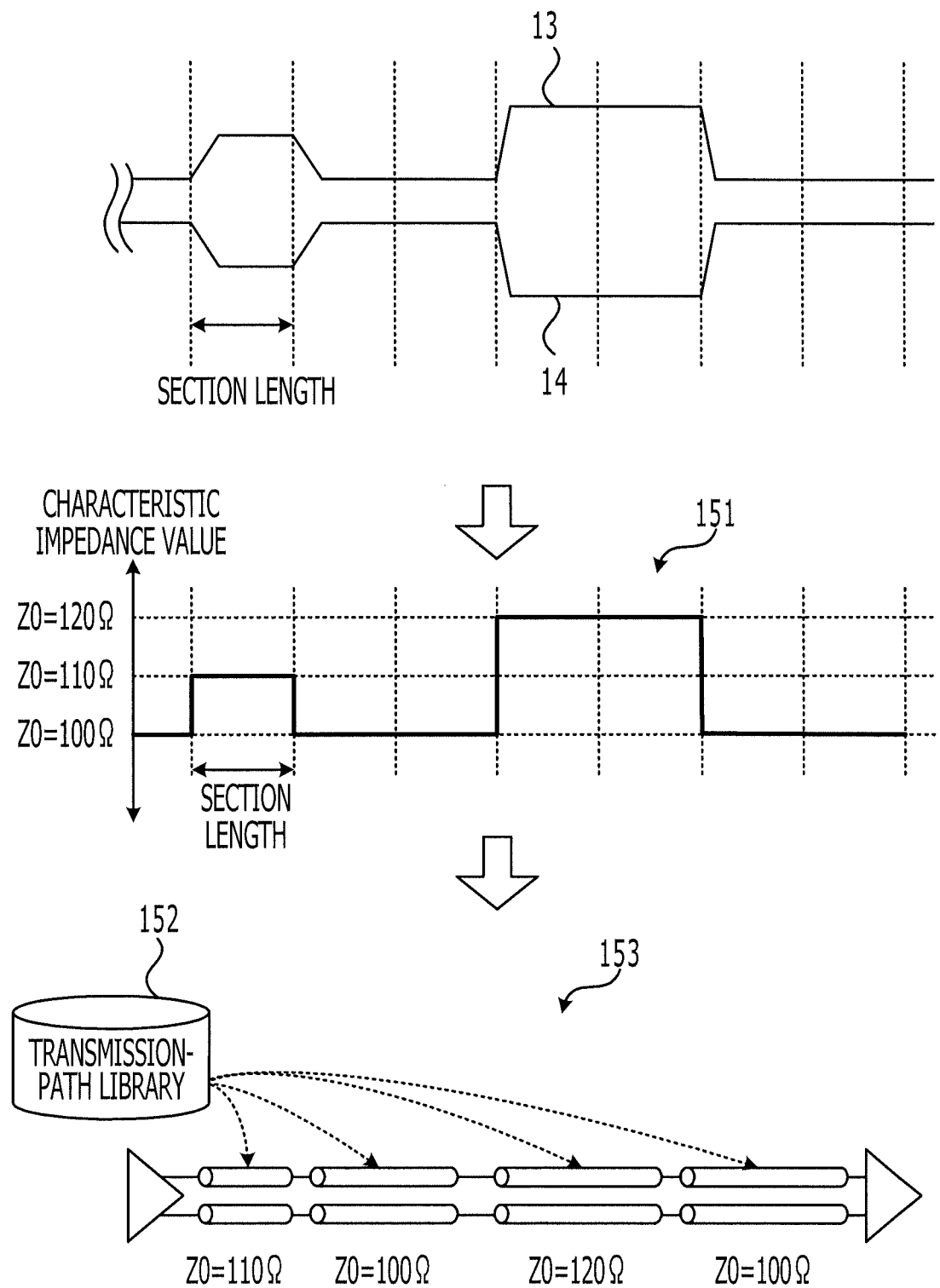
FIG. 12 illustrates one example of creation of a simulation model.

FIG. 12 illustrates one example of creation of a simulation model. More specifically, FIG. 12 illustrates a transmission-path model 151 that the model creating unit 150 created on the basis of the wire models 13 and 14. An X axis in the transmission-path model 151 represents a physical position of the wire models. A Y axis represents a characteristic impedance extracted by the characteristic-impedance calculating unit 140.

FIG. 12 also illustrates a simulation model 153 that the model creating unit 150 created on the basis of the transmission-path model 151 and a transmission-path library 152.

In the simulation model 153, sections where the characteristic impedances are the same are expressed by a continuous section model and sections where the characteristic impedances are different from each other are expressed by discontinuous section models.

<Determination Approval/Denial>

Figure 13:
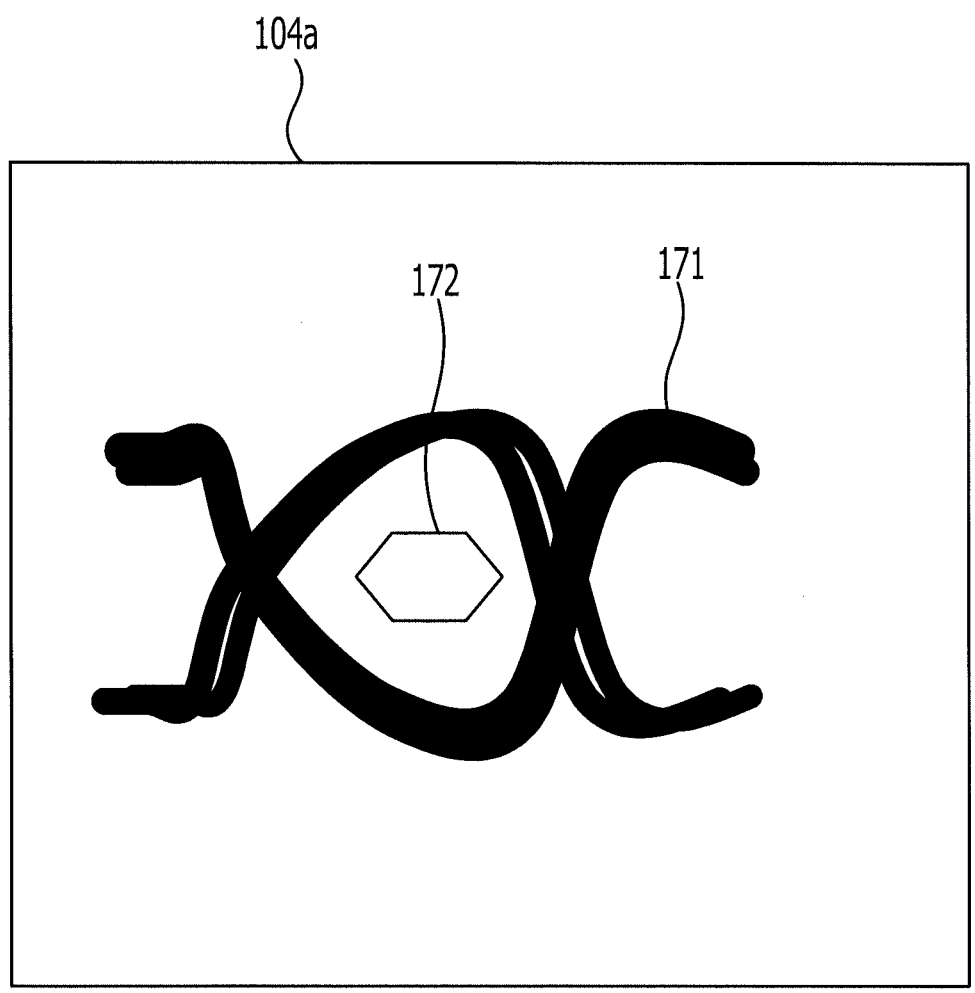
FIG. 13 illustrates one example of an approval/denial determination displayed on a monitor.

FIG. 13 illustrates an example of approval/denial determination displayed on the monitor. The approval/denial determining unit 170 applies a mask 172, which is based on the standard of the reception element model 12, to a created eye-pattern waveform 171 and checks whether or not the eye-pattern waveform 171 interrupts the mask 172, to thereby determine the approval/denial of the wire spacing relevant to the quality of the wiring design. Since the eye-pattern waveform 171 illustrated in FIG. 13 does not have a portion overlapping the mask 172, the approval/denial determining unit 170 determines that the wire spacing of the wire model is approved.

As described above, according to the wire-spacing verification apparatus 100 of the present embodiment, the characteristic-impedance calculating unit 140 determines the appropriate section length of the characteristic-impedance calculation sections on the basis of equation (2). This arrangement allows the appropriate section length of the characteristic-impedance calculation sections to be set regardless of the skill of the user. Thus, since a simulation model based on the section length is created and an approval/denial determination is made, the user can easily obtain a reliable result of approval/denial determination of the wire spacing by only selecting target nets.

Computation involved in the setting of the section length is a simple computation compared to, for example, computations executed by typical three-dimensional electromagnetic analyzing software. Thus, it is possible to reduce the time required for computation processing.

Although two adjacent signals constitute a differential pair in the present embodiment, the disclosed wire-spacing verification apparatus 100 can also be used for a circuit model having single wires that are independent from each other.

Figure 14:
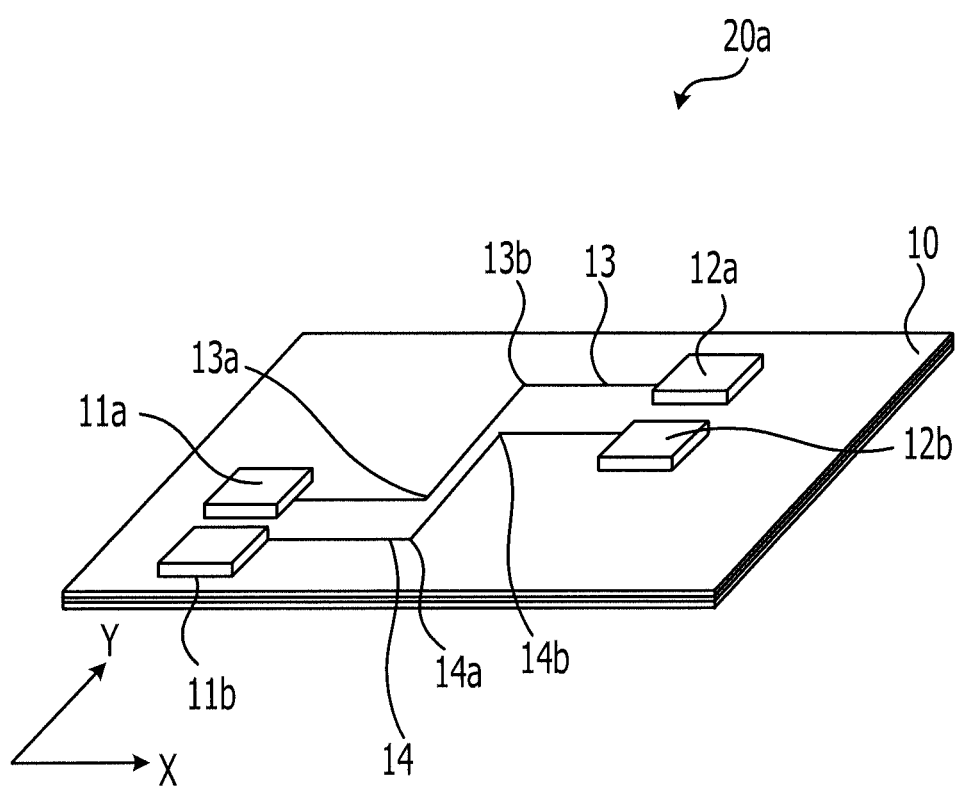
FIG. 14 illustrates one example of a circuit model having single wires.

FIG. 14 illustrates one example of a circuit model having single wires. Portions having substantially the same functions as those illustrated in FIG. 4 are denoted by the same reference numerals and detailed descriptions thereof are not given hereinafter.

A circuit model 20a illustrated in FIG. 14 has a wire model 13 and a wire model 14. The wire model 13 transmits a single-end signal, generated by a transmission element model 11a, to a reception element model 12a. The wire model 14 transmits a single-end signal, generated by a transmission element model 11b, to a reception element model 12b. In this case, it is preferable that, when the trtf of the transmission element model 11a and the trtf of the transmission element model 11b are different from each other, the smaller trtf thereof be used to calculate equation (2) to determine the section length. Such an approach can enhance the accuracy of the approval/denial determination.

In the present embodiment, the section length is calculated throughout the entire wire models. The arrangement, however, is not limited to the described example, and the section length may also be calculated with respect to only a specific portion of the wire models.

For example, change points in the physical shapes of the wire models may be set. In the wire models 13 and 14 illustrated in FIG. 14, the change points correspond to, for example, bending portions 13a and 14a and bending portions 13b and 14b which bend at substantially 90°. A section length in the vicinity of each change point is calculated and an approval/denial determination is performed on only the characteristic impedances in the calculated section length. The result of the approval/denial determination may be used as an approval/denial result of the entire wire models 13 and 14. Such an arrangement can reduce the computation time and can speed up the processing.

The change points are not limited to the bending portions and may be points at which the dielectric characteristics vary. The sections whose section length is to be calculated may be arbitrarily determined by the user, or predetermined characteristic-impedance calculation sections (e.g., one section) may be provided at each of two opposite sides of a change point with the change point being the center thereof.

The present embodiment is aimed to detect discontinuous points of impedances. Thus, when the characteristic impedances are uniformly different from the reference impedance throughout the entire transmission path of the wire models, there is a possibility that false-negative detection occurs. Accordingly, the arrangement may also be such that an average value of the characteristic impedances of the entire transmission path of the wire models is determined so that, when the average value does not satisfy predetermined variation references including the reference impedance, an alarm message is displayed or an alarm using a warning tone or the like is issued to user.

Next, a description will be given of a wire-spacing verification apparatus according to a third embodiment. The wire-spacing verification apparatus of the third embodiment will be described below in conjunction with, mainly, points that are different from those of the second embodiment described above, and similar points are not described hereinafter.

The wire-spacing verification apparatus of the third embodiment is different from the wire-spacing verification apparatus 100 of the second embodiment in that a characteristic-change distribution map with its horizontal axis being the wire direction is used to set a graphical index for approval/denial determination.

Figure 15:
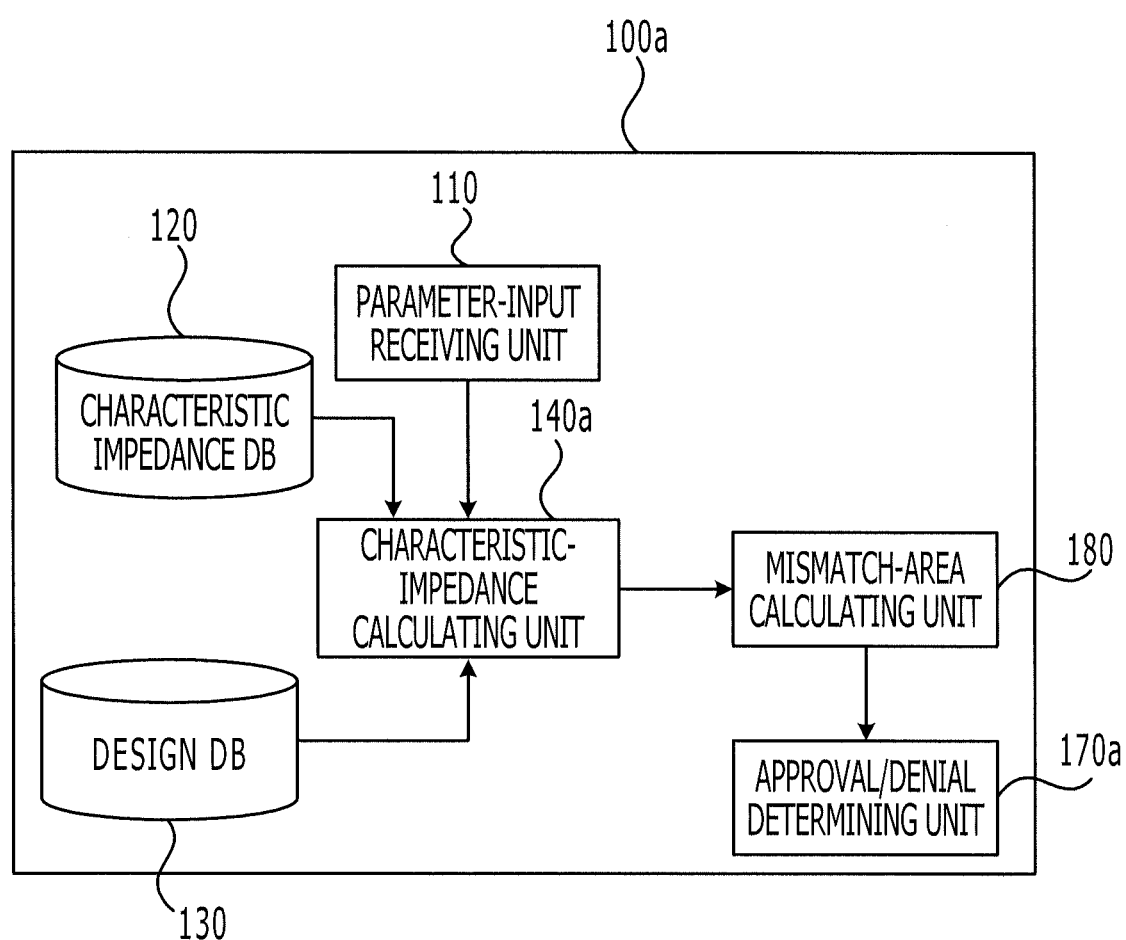
FIG. 15 illustrates functions of a wire-spacing verification apparatus according to a third embodiment.

FIG. 15 is a block diagram illustrating functions of the wire-spacing verification apparatus of the third embodiment. A wire-spacing verification apparatus 100a of the third embodiment has a characteristic-impedance calculating unit 140a having functions that are partly different from those of the characteristic-impedance calculating unit 140. The wire-spacing verification apparatus 100a also has a mismatch-area calculating unit 180 and an approval/denial determining unit 170a instead of the model creating unit 150, the simulation executing unit 160, and the approval/denial determining unit 170.

The characteristic-impedance calculating unit 140a calculates a reference impedance representing a reference value for the characteristic impedances in a predetermined number of characteristic-impedance calculation sections. The reference impedance in the present embodiment is conceptually different from the reference impedance included in equation (4) in the second embodiment.

Figure 16A:
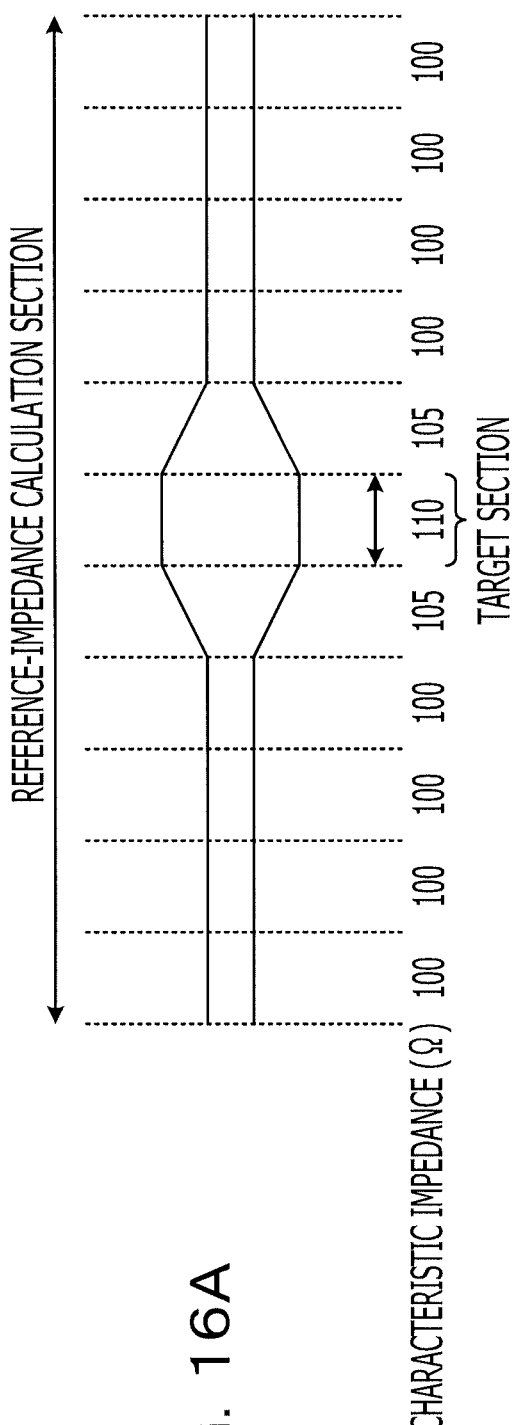
FIGS. 16A and 16B illustrate an example of calculation of a reference impedance.
Figure 16B:
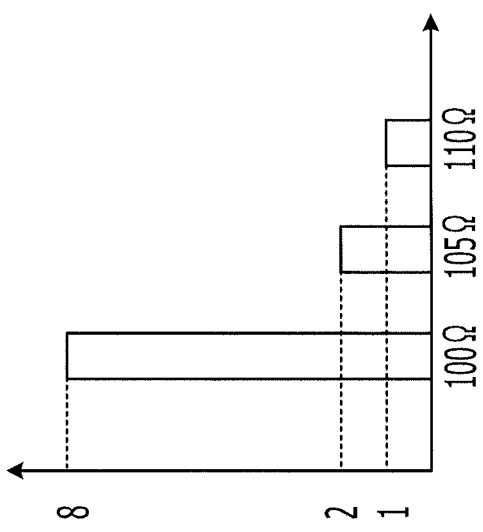

FIGS. 16A and 16B illustrate an example of calculation of the reference impedance. The characteristic-impedance calculating unit 140a determines a section in which the reference impedance is to be calculated. More specifically, first, the characteristic-impedance calculating unit 140a sets, as a target section, a characteristic-impedance calculation section of the wire models 13 and 14 which is coupled to the transmission element model 11. The characteristic-impedance calculating unit 140a then sets, as a reference-impedance calculation section, a predetermined number of characteristic-impedance calculation sections (in this case, 11 characteristic-impedance calculation sections) including the target section and leading to the reception element model 12. The number of characteristic-impedance calculation sections may be set by, for example, the user.

The characteristic-impedance calculating unit 140a sets all characteristic-impedance calculation sections as the target section, while shifting the target section toward the reception element model 12. More specifically, the characteristic-impedance calculation section adjacent to the characteristic-impedance calculation section of the wire models 13 and 14 which is coupled to the transmission element model 11 becomes a next target section. In this case, a total of 11 characteristic-impedance calculation sections, that is, the target section, one characteristic-impedance calculation section adjacent to the transmission element model 11 side of the target section, and nine characteristic-impedance calculation sections adjacent to the reception element model 12 side of the target section, are set as the reference-impedance calculation section.

Such processing is performed until the target section shifts to some extent and five characteristic-impedance calculation sections to the left and right of the target section can be obtained.

FIG. 16A illustrates a state in which the target section shifts to some extent and five characteristic-impedance calculation sections to the left and right of the target section can be obtained. When the characteristic impedances of the characteristic-impedance calculation sections are 100Ω, 100Ω, 100Ω, 100Ω, 105Ω, 110Ω, 105Ω, 100Ω, 100Ω, 100Ω, and 100Ω from the left hand side, the characteristic impedance 100Ω that is most frequently found (i.e., that is indicated by the highest point of a histogram in FIG. 16B) is set as the reference impedance of the reference-impedance calculation section. A Max function prepared in a typical programming language may be used in order to determine the highest point of the histogram.

A description will be given with reference back to FIG. 15. The mismatch-area calculating unit 180 determines a difference between the reference impedance and a characteristic-impedance curve with respect to each of the characteristic-impedance calculation sections. The determined difference is used as a mismatch area of the corresponding characteristic-impedance calculation section. The mismatch area of each section is expressed by equation (5) below:

$$\text{Mismatch Area} = trtf(\text{ns}) \times \text{Reference Impedance } (\Omega) \times \text{Determination Coefficient } A \qquad (5).$$

The determination coefficient A is provided in order to exclude a small mismatch, such as a mismatch that does not cause a problem in practice, from target for summation. The determination coefficient A is associated with a determination coefficient B (described below). For example, when the determination coefficient B is 0.1, the determination coefficient A may be set to, for example, 0.01, which is one tenth of the determination coefficient B.

When the sections having mismatch areas continue, the sections are regarded as one group to add up the mismatch areas. A value resulting from the addition is used as a continuous mismatch area. The continuous section is a section up to a section in which the mismatch area is 0, subjecting to the presence/absence of the mismatch area of the previous section.

FIGS. 17A and 17B illustrate calculation of the mismatch area. The reference impedance of the reference-impedance calculation section illustrated in FIG. 17A is 100Ω. In the four characteristic-impedance calculation sections from the left hand side, the difference between the characteristic impedance curve and the reference impedance is 0. In the fifth characteristic-impedance calculation section from the left hand side, the difference between the characteristic impedance curve and the reference impedance is 5Ω. In the sixth characteristic-impedance calculation section from the left hand side, the difference between the characteristic impedance curve and the reference impedance is 10Ω. In the seventh characteristic-impedance calculation section from the left hand side, the difference between the characteristic impedance curve and the reference impedance is 5Ω. In the eighth to eleventh characteristic-impedance calculation sections from the left hand side, the difference between the characteristic impedance curve and the reference impedance is 0.

Thus, in the fifth to seventh characteristic-impedance calculation sections, mismatch areas exist continuously. In FIG. 17B, a mismatch area M1 of the hatched portion for the fifth characteristic-impedance calculation section is 52.5 (Ω·ns) =105 (Ω)×0.5 (ns). A mismatch area M2 of the hatched portion for the sixth characteristic-impedance calculation section is 55 (Ω·ns)=110 (Ω)×0.5 (ns). A mismatch area M3 of the hatched portion for the seventh characteristic-impedance calculation section is 52.5 (Ω·ns)=105 (Ω)×0.5 (ns).

Next, a continuous mismatch area is determined. Since the mismatch areas exist continuously in the fifth to seventh characteristic-impedance calculation sections, the sum of the mismatch areas of the fifth to seventh characteristic-impedance calculation sections yields a continuous mismatch area. Specifically, the continuous mismatch area is given by: 52.5 (Ω·ns)+55 (Ω·ns)+52.5 (Ω·ns)=160 (Ω·ns).

A description will be given with reference back to FIG. 15. The approval/denial determining unit 170a makes a wire-spacing approval/denial determination by judging whether or not the sum of the mismatch areas from the start section of the wires coupled to the transmission element to the end section thereof is within a permissible value. Specifically, the approval/denial determining unit 170a makes the wire-spacing approval/denial determination by using equation (6) below:

$$\text{Continuous Mismatch Area} < trtf(\text{ns}) \times \text{Reference Impedance } (\Omega) \times \text{Determination Coefficient } B \qquad (6).$$

The determination coefficient B has a value that permits a difference in the characteristic impedance curve relative to the reference impedance, and may be arbitrarily specified. The determination coefficient B may be, for example, 0.1. The determination coefficient B of 0.1 indicates that a 10% difference in the characteristic-impedance curve relative to the reference impedance is permitted.

When the relationship indicated by equation (6) noted above is satisfied, the approval/denial determining unit 170a determines that the wire spacing of the wire models is approved.

Through such determination processing, mismatches that are permissible for use can be excluded from wire-spacing errors.

Figure 18:
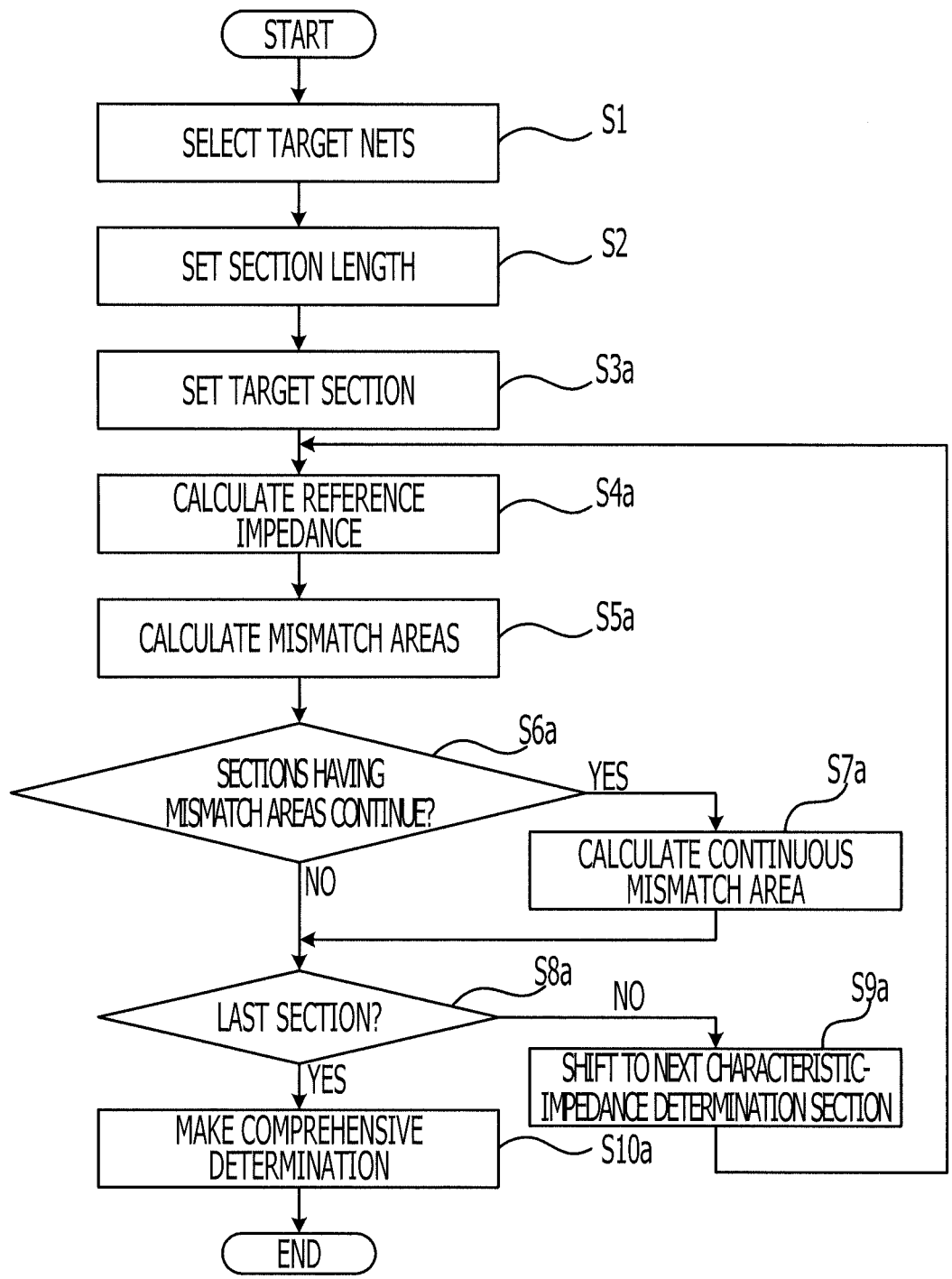
FIG. 18 illustrates overall processing of the wire-spacing verification apparatus according to the third embodiment.

FIG. 18 is a flowchart illustrating overall processing of the wire-spacing verification apparatus of the third embodiment. Processing operations that are substantially the same as the processing operations in the second embodiment are denoted by the same operation numerals and descriptions thereof are not given hereinafter.

In operation S3a, the characteristic-impedance calculating unit 140a sets, as a target section, the characteristic-impedance calculation section adjacent to the transmission element model. Thereafter, the process proceeds to operation S4a.

In operation S4a, the characteristic-impedance calculating unit 140a calculates a reference impedance of the reference-impedance calculation section determined by the determined target section. Thereafter, the process proceeds to operation S5a. In operation S5a, the mismatch-area calculating unit 180 calculates mismatch areas. Thereafter, the process proceeds to operation S6a.

In operation S6a, the mismatch-area calculating unit 180 judges whether or not the sections having the mismatch areas continue in the reference-impedance calculation section. When the sections having the mismatch areas continue (Yes in operation S6a), the process proceeds to operation S7a. When continuous sections having the mismatch areas do not exist (No in operation S6a), the process proceeds to operation S8a.

In operation S7a, the mismatch-area calculating unit 180 calculates a continuous mismatch area of the continuous sections having the mismatch areas. Thereafter, the process proceeds to operation S8a. In operation S8a, the mismatch-area calculating unit 180 determines whether or not the section in which the mismatch area is calculated is the last section, i.e., is the section coupled to the reception element model. When the section in which the mismatch area is determined is not the last section (No in operation S8a), the process proceeds to operation S9a. When the section in which the mismatch area is determined is the last section (Yes in operation S8a), the process proceeds to operation S10a.

In operation S9a, the target section shifts to the next characteristic-impedance calculation section (i.e., the characteristic-impedance calculation section adjacent to the current target section). Thereafter, the process proceeds to operation S4a, processing in operation S4a and the subsequent operations is continuously performed on the target section of the characteristic-impedance calculation section.

In operation S10a, the approval/denial determining unit 170a makes an approval/denial determination on the sum of the continuous mismatch areas from the start section to the last section. Equation (6) noted above is used as a criteria for the determination. Thereafter, the entire processing ends. The description of the processing of the wire-spacing verification apparatus 100a is finished at this point.

The wire-spacing verification apparatus 100a of the third embodiment provides substantially the same advantage as the wire-spacing verification apparatus 100 of the second embodiment.

The wire-spacing verification apparatus 100a of the third embodiment further makes it possible to reduce the calculation time for the simulation and also makes it possible to reduce the operation time of the entire verification processing.

In the present embodiment, the characteristic impedance "100Ω" at the vertex in the histogram is set as the reference impedance for the characteristic-impedance calculation sections. However, the determination of the reference impedance is not limited to the example. For example, when a case in which the mismatch portion is small relative to the entire transmission path is postulated, the average value of the characteristic impedances may be used as the reference impedance. With such a method, the reference impedance can be calculated using a simpler mathematical equation. According to the method, for example, the reference impedance of the reference-impedance calculation section illustrated in FIG. 16A is given by $(100 \times 8 + 105 \times 2 + 110(1))/11 = 101.8(( )$.

Next, a description will be given of a wire-spacing verification apparatus according to a fourth embodiment. The wire-spacing verification apparatus of the fourth embodiment will be described below in conjunction with, mainly, points that are different from those of the second embodiment described above, and similar points are not described hereinafter.

The wire-spacing verification apparatus of the fourth embodiment is different from the wire-spacing verification apparatus 100 of the second embodiment in that the wire-spacing verification apparatus of the fourth embodiment has a function for dealing with a case in which a wide-range conductor (solid conductor) that serves as a reference for the characteristic impedances has a gap.

Figure 19:
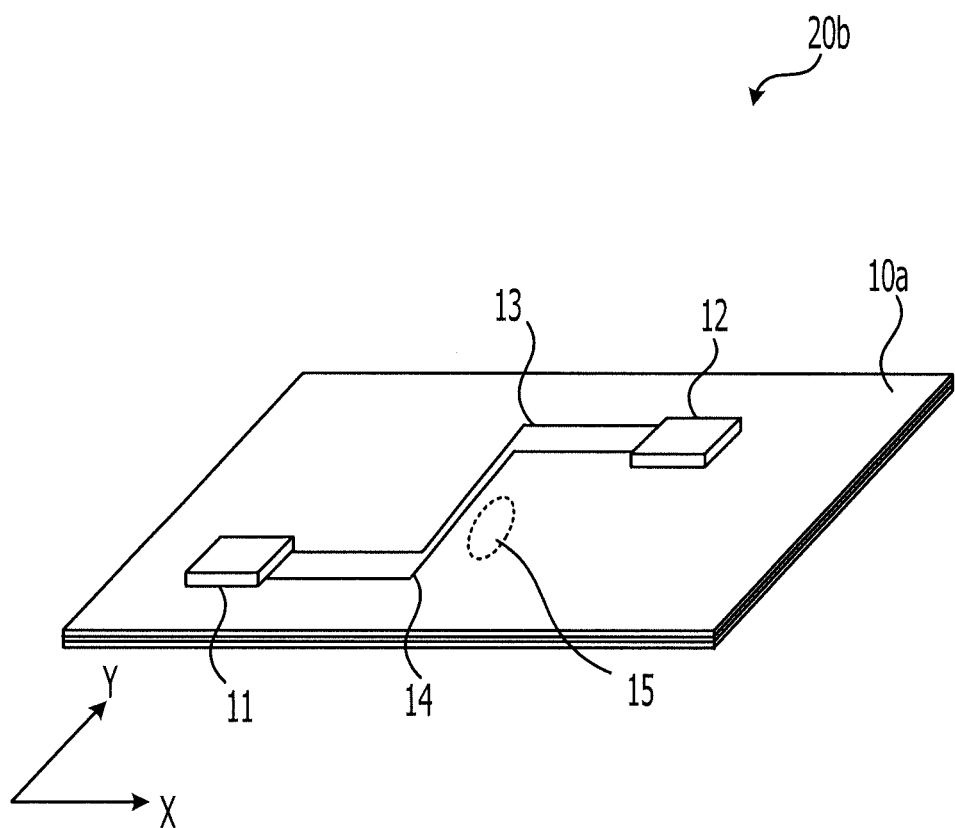
FIG. 19 illustrates the structure of a wire-spacing verification apparatus according to a fourth embodiment.

FIG. 19 is a perspective view illustrating the structure of a substrate model in the fourth embodiment. A substrate model 10a in a circuit model 20b illustrated in FIG. 19 has a gap-region model (a through-hole model) 15, formed in a ground layer immediately below a layer in which the wire models 13 and 14 are disposed, for example, in order to pass inter-layer wires.

When the wire model 13 and 14 and the gap-region model 15 are adjacent to each other, there is a possibility that a mismatch of the characteristic impedances of the wire models 13 and 14 occurs. The mismatch of the characteristic impedances leads to deterioration of the signal characteristics of the wire models.

In this case, for the substrate model 10a illustrated in FIG. 19, the gap region causes deterioration of the signal characteristics of the wire models when the gap-region model 15 exists in the dielectric layer that is the same as the dielectric layer in which the wire models 13 and 14 are formed, that is one layer higher, or that is one layer lower, and the wire models 13 and 14 and the gap-region model 15 are adjacent to each other in plan view.

In order to improve the work efficiency at the stage of designing the wire structure of the substrate model, the wire-spacing verification apparatus 100b performs calculation to determine a wire model having a large amount of change in the characteristic impedance. For calculation of the amount of change in the characteristic impedance, the section length determined in the second embodiment is set.

Figure 20:
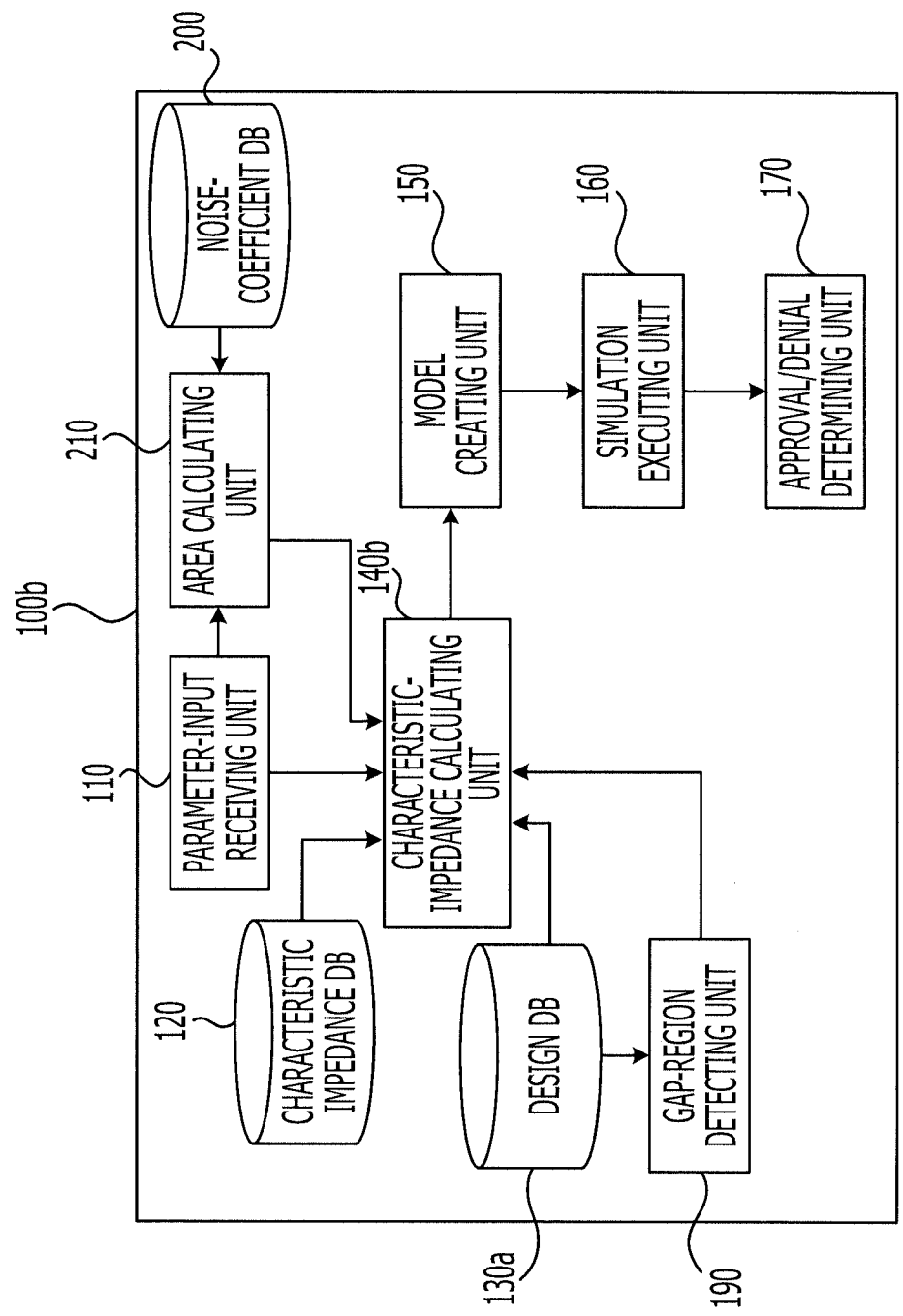
FIG. 20 illustrates functions of the wire-spacing verification apparatus according to the fourth embodiment.

Next, a description will be given of functions of the wire-spacing verification apparatus 100b according to the fourth embodiment. FIG. 20 is a block diagram illustrating functions of the wire-spacing verification apparatus according to the fourth embodiment.

The wire-spacing verification apparatus 100b includes a design DB 130a and a characteristic-impedance calculating unit 140b. The design DB 130a stores information in addition to the information stored in the design DB 130. The characteristic-impedance calculating unit 140b has a function in addition to the functions of the characteristic-impedance calculating unit 140. The wire-spacing verification apparatus 100b further includes a gap-region detecting unit 190, a noise-coefficient DB 200, and an area calculating unit 210.

The gap-region detecting unit 190 and the area calculating unit 210 may be implemented by a function of the CPU 101. The noise-coefficient DB 200 may be implemented by a function of the HDD 103. The design DB 130a contains data (gap-region data) regarding a gap-region model.

Figure 21:
FIG. 21 illustrates gap-region data in the fourth embodiment.

FIG. 21 illustrates an example of the gap-region data in the fourth embodiment. A gap-region data table 132 illustrated in FIG. 21 has columns of a net number, a wire layer, a diameter, and center coordinates. Pieces of information that are horizontally arranged are associated with each other. In the column "net number", information for identifying gap-region models is set. In the column "wire layer", information for identifying, in the substrate model, layers in which the corresponding gap-region wire-models exist is set. In the column "diameter (mm)", the diameter (the maximum diameter) of the gap-region model is set.

Each of the columns "center coordinates (mm)" is further divided into a column "X coordinate" and a column "Y coordinate". The X coordinate and the Y coordinate represent coordinates, for example, when a lower left vertex of the substrate model 10a illustrated in FIG. 19 is set as a reference (0, 0) and sides extending from the vertex to other vertices are represented by an X axis and a Y axis. In the column "X coordinate", the X coordinate of the center of the gap-region model is set. In the column "Y coordinate", the Y coordinate of the center of the gap-region model is set. A description will be given with reference back to FIG. 20.

On the basis of the X and Y coordinates of the wire models which are set in the design data table 131 and the X and Y coordinates of the gap-region models which are set in the gap-region data table 132 illustrated in FIG. 21, the gap-region detecting unit 190 classifies the positional relationships of the gap-region models relative to the wire models in plan view and generates a classification result. Details are described with reference to FIG. 22.

The area calculating unit 210 extracts a wire model of a net specified by the parameter-input receiving unit 110 and calculates the area of a gap region located in, in plan view, the width-direction range in which the amount of change in the characteristic impedance is to be calculated.

By using the positional relationship between the wire model and the gap-region model classified by the gap-region detecting unit 190 and the gap-region model area calculated by the area calculating unit 210, the characteristic-impedance calculating unit 140b calculates, for each section, the amount of change in the wire-model characteristic impedance to be calculated.

Next, a description will be given of determination of the positional relationship between the wire model and the gap region, the determination being made by the wire-spacing verification apparatus 100b. The determination of the positional relationship is executed by the gap-region detecting unit 190.

FIG. 22 illustrates exemplary results of classification of the positional relationships between wire models and gap regions, the classification being performed by the wire-spacing verification apparatus according to the fourth embodiment.

A classification data table 191 illustrated in FIG. 22 contains data representing the classification results. On the basis of the X and Y coordinates of the wire models which are indicated by the design data table 131 and the X and Y coordinates of the gap-region models which are indicated by the gap-region data table 132, the gap-region detecting unit 190 classifies the positions of the gap-region models relative to the wire models in plan view.

In addition to classifying the positional relationships in plan view, the gap-region detecting unit 190 determines whether or not each gap-region model exits in the layer that is the same as the layer of the wire model, that is one layer higher, or that is one layer lower (i.e., determines whether or not the gap region and the wire model are located within two layers).

More specifically, the gap-region detecting unit 190 determines, in the XY coordinates, positional relationships between the X and Y coordinate values of the start point and the end point which represent each section of the wire model and the X and Y coordinate values of the gap-region model which are indicated in the gap-region data table 132, to thereby classify the position of the gap-region model relative to the wire model in plan view. The position of the gap-region model relative to the wire model in plan view is classified into any of "one side of a wire", "both sides of a wire", and "immediately above/below of a wire".

In the classification data table 191, "1" is set for the portions corresponding to the classified positions and "0" is set for other portions.

The gap-region detecting unit 190 determines whether or not a value obtained by subtracting the number of the wire layer in the gap-region model from the number of the wire layer in the wire model is 0, +1, or −1. When the value is +2 or more or is −2 or less, it is presumed that another solid-conductor model is formed between the wire model and the gap-region model. Thus, it can be regarded that the wire model to be judged and the gap-region model do not have a relationship leading to deterioration of the signal characteristics.

Through the determination described above, the gap-region detecting unit 190 classifies the positional relationships between the wire models and the gap-region models and creates the classification data table 191.

Figure 23:
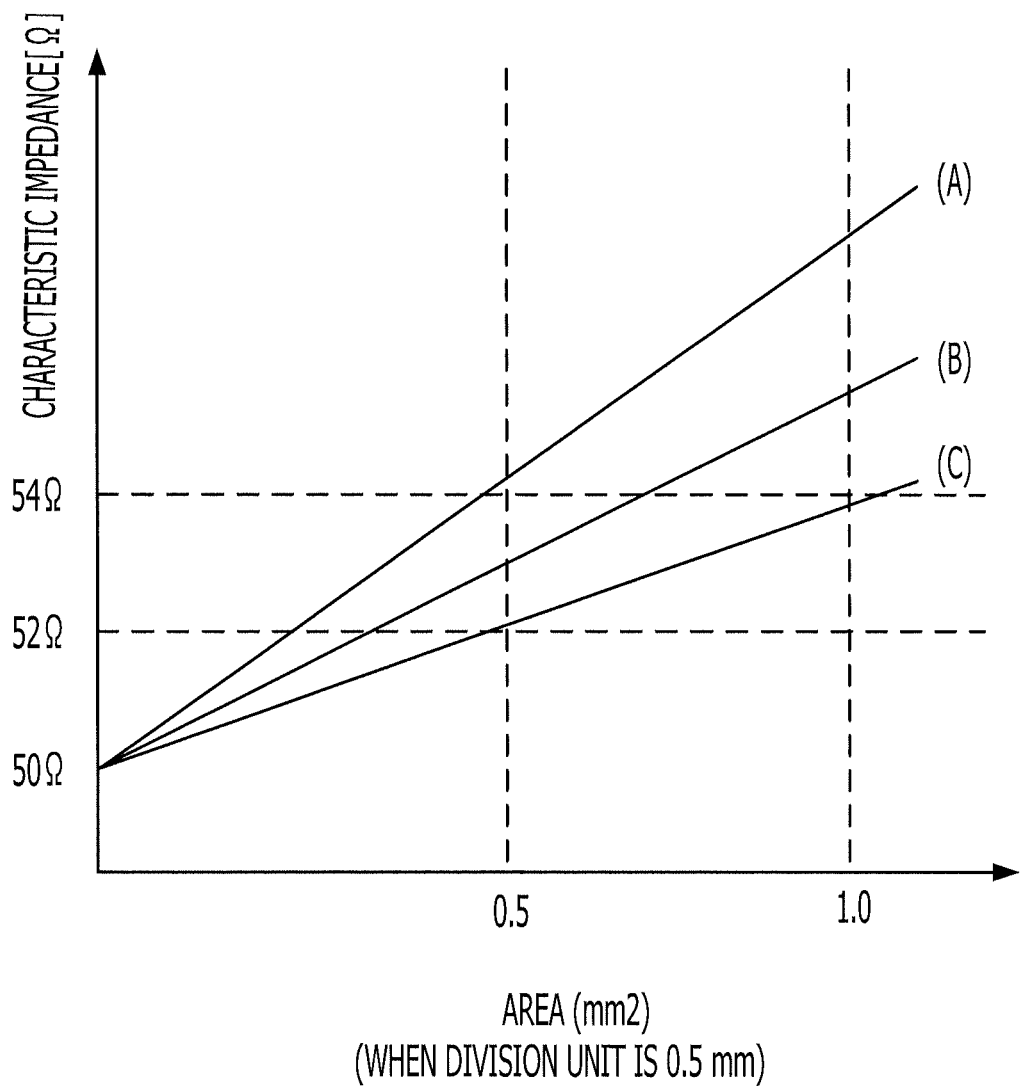
FIG. 23 illustrates increase characteristics of characteristic impedances stored in a noise-coefficient DB.

FIG. 23 illustrates increase characteristics of characteristic impedances stored in the noise-coefficient DB. Data representing the increase characteristics are used for calculating the amount of change in the characteristic impedance and are representative of increases (degradation) in the characteristic impedance per unit area for the gap-region model with respect to the positional relationship between the wire model and the gap-region model.

The data representing the increase characteristics illustrated in FIG. 23 represent the amount of change in the signal characteristics of the wire model with respect to the positional relationship between the wire model and the gap-region model and the size of the gap-region model.

The positional relationship between the wire model and the gap-region model may be classified into one of three patterns: (A) the gap-region model being located immediately above or below the wire model, (B) the gap-region model being located at both sides of the wire model, and (C) the gap-region model being located at only one side of the wire model. In this case, when an ideal characteristic impedance of the wire model is assumed to be 50Ω, the degree of mismatch of the characteristic impedances increases in the order of the positional relationships (C), (B), and (A). Thus, with respect to the characteristics illustrated in FIG. 23, an increase coefficient (i.e., the gradient of the characteristics) is set so that the characteristic impedance for the positional relationship (A) is the highest and the characteristic impedance decrease in the order of the positional relationships (B) and (C).

Figure 24:
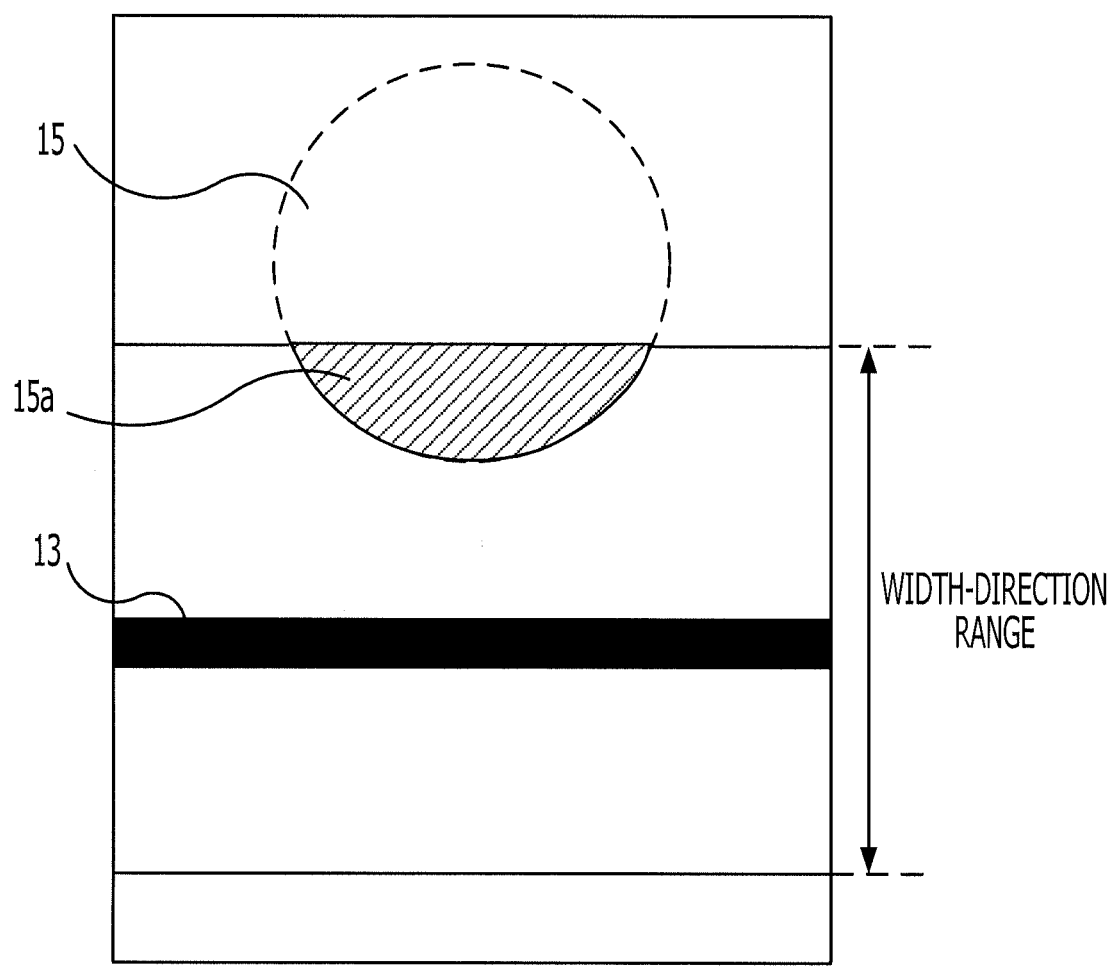
FIG. 24 illustrates a width-direction range in which the wire-spacing verification apparatus of the fourth embodiment is to calculate the amount of change in the characteristic impedance.

FIG. 24 illustrates a width-direction range in which the wire-spacing verification apparatus of the fourth embodiment calculates the amount of change in the characteristic impedance. FIG. 24 is an enlarged view of the positional relationships between the wire model 13 and the gap-region model 15 formed in the substrate model 10a and the width-direction range in which the amount of change in the characteristic impedance is to be calculated (i.e., the width-direction range for calculation).

The wire-spacing verification apparatus 100b calculates the amount of change in the characteristic impedance after presetting the width-direction range for the calculation. The user may designate the width direction range for the calculation. The user designation is received by the parameter-input receiving unit 110. A case in which the width-direction range is set to 40 times (4.0 mm) the wire width (0.1 mm) of the wire model 13 will now be described by way of example.

As illustrated in FIG. 24, a portion 15a (indicated by hatching) of the gap-region model 15 located adjacent to the wire model 13 in plan view is a range included within 4.0 mm from the wire model 13.

In this case, the wire-spacing verification apparatus 100b determines the amount of change in the characteristic impedance of the wire model 13, the change being caused by the portion 15a that is included in the gap-region model 15 and in the width-direction range for the calculation. Determination of the amount of change in the characteristic impedance makes it possible to evaluate an influence on the signal characteristics of the wire model 13. With a similar approach, it is also possible to evaluate an influence of the signal characteristics on the wire model 14.

Figure 25:
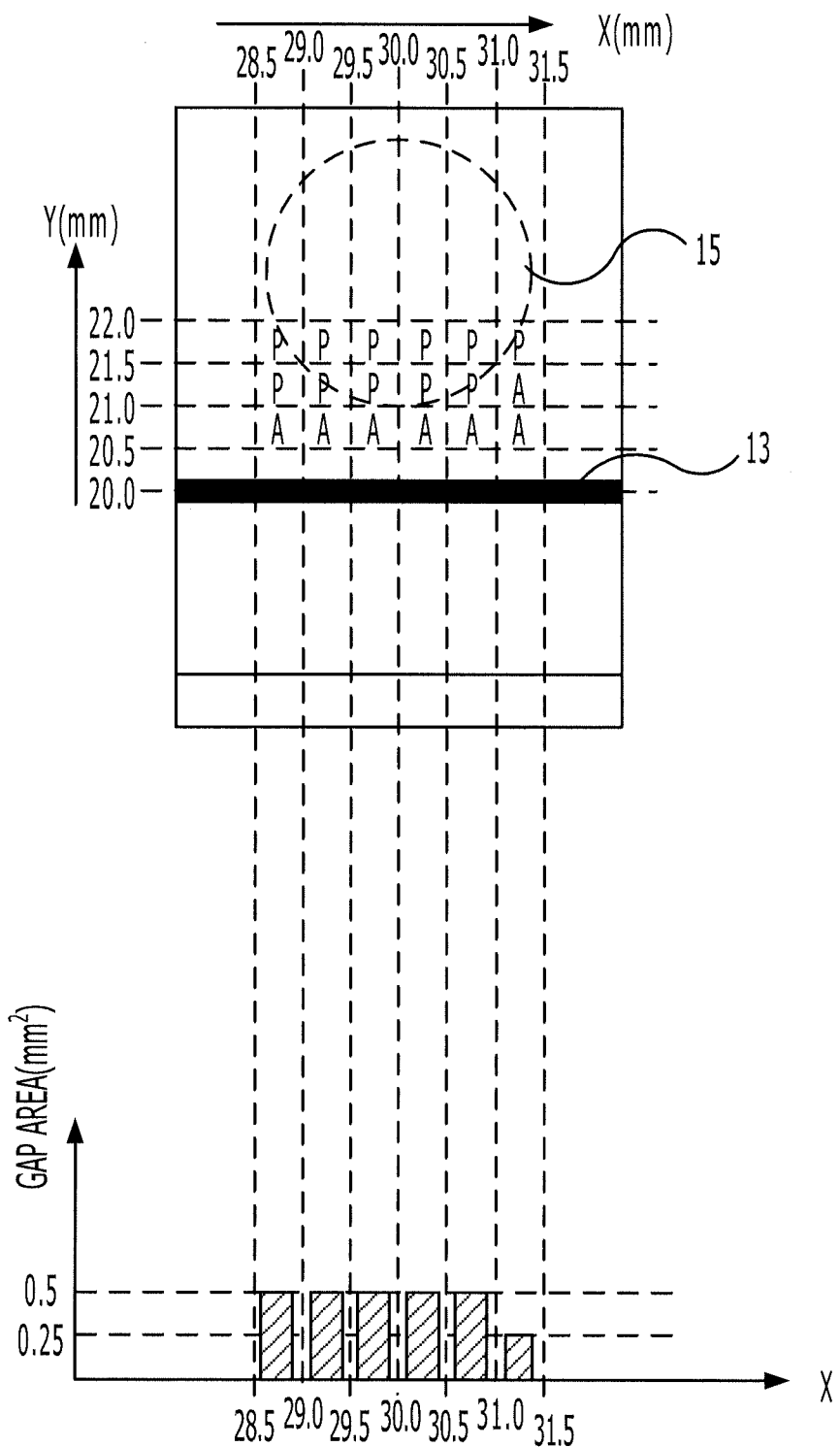
FIG. 25 illustrates a method for calculating the area of a gap region that is present in the width-direction range in which the wire-spacing verification apparatus of the fourth embodiment is to calculate the amount of change in the characteristic impedance.

FIG. 25 illustrates a method for calculating the area of the gap region that is present in the width-direction range in which the wire-spacing verification apparatus of the fourth embodiment is to calculate the amount of change in the characteristic impedance. Now, a description will be given using the wire model 13 and the gap-region model 15.

The gap-region detecting unit 190 detects the gap-region model 15 in the width-direction range in which the amount of change in the characteristic impedance is to be calculated. The area calculating unit 210 calculates the area of the gap-region model 15 on the basis of a result of the detection performed by the gap-region detecting unit 190.

For the detection and the area calculation of the gap-region model 15, a region located between the start point and the end point of the wire model 13 to be calculated and located in the width-direction range for the calculation is sectioned into square segments each having a predetermined area. The wire model 13 is divided into sections each having the length of the side of each square segment and determines the presence/absence of the gap-region model 15 for each segment.

When it is determined in the presence/absence of the gap-region model 15 that the gap-region model 15 is present in at least part of the segment, it is determined that the gap region is present in the segment. That is, when the gap-region model 15 does not exist in any part of the segment to be determined, it is determined that a gap region is absent in the segment. The length of one side of each segment is set to the section length.

In the present embodiment, in order to set the length of one side representing the segment to 0.5 mm, the wire model 13 is divided into 0.5 mm sections in the longitudinal direction. The area calculating unit 210 then calculates the area of the gap-region model 15 for each section.

The smallest of the numeric values of the coordinates of the four corners of each segment are used as the segment coordinates. That is, in FIG. 25, the coordinate values of the lower-left vertex are used as coordinates for specifying each segment.

In the example illustrated in FIG. 25, with respect to the segments included in the range of X=28.5 to 31.5 and the range of Y=20.0 to 22.0, the presence/absence of the gap-region model 15 is determined for each of the sections in increments of 0.5 mm in the X-axis direction. In FIG. 25, character "P" is indicated in each segment in which the gap-region model 15 is determined to be present and character "A" is indicated in each segment in which the gap-region model 15 is determined to be absent.

The area of each section of the wire model 13 is determined based on the number of segments for each section. That is, the area of the section of X=28.5 to 29.0 is 0.5 mm2, the area of the section of X=29.0 to 29.5 is 0.5 mm2, the area of the section of X=29.5 to 30.0 is 0.5 mm2, the area of the section of X=30.0 to 30.5 is 0.5 mm2, the area of the section of X=30.5 to 31.0 is 0.5 mm2, and the area of the section of X=31.0 to 31.5 is 0.25 mm2.

FIG. 26 is a table illustrating the determination results in FIG. 25. A flag "1" is set for the segment determined to have the gap region and a flag "0" is set for a unit area determined to have no gap region. The characteristic-impedance calculating unit 140b uses the flags to calculate the amount of change in the characteristic impedance.

In the determination results illustrated in FIG. 26, the area of the gap-region model 15 in each section in the wire models 13 and 14 is expressed by a value obtained by multiplying the number of flags "1" representing the presence of the gap region in the section by the unit area (0.25 mm2) of each segment.

Although the determination results illustrated in FIG. 26 are results for the wire model 13, determination results can be similarly obtained for all sections of wire models corresponding to attribute information generated by the parameter-input receiving unit 110.

Figure 27:
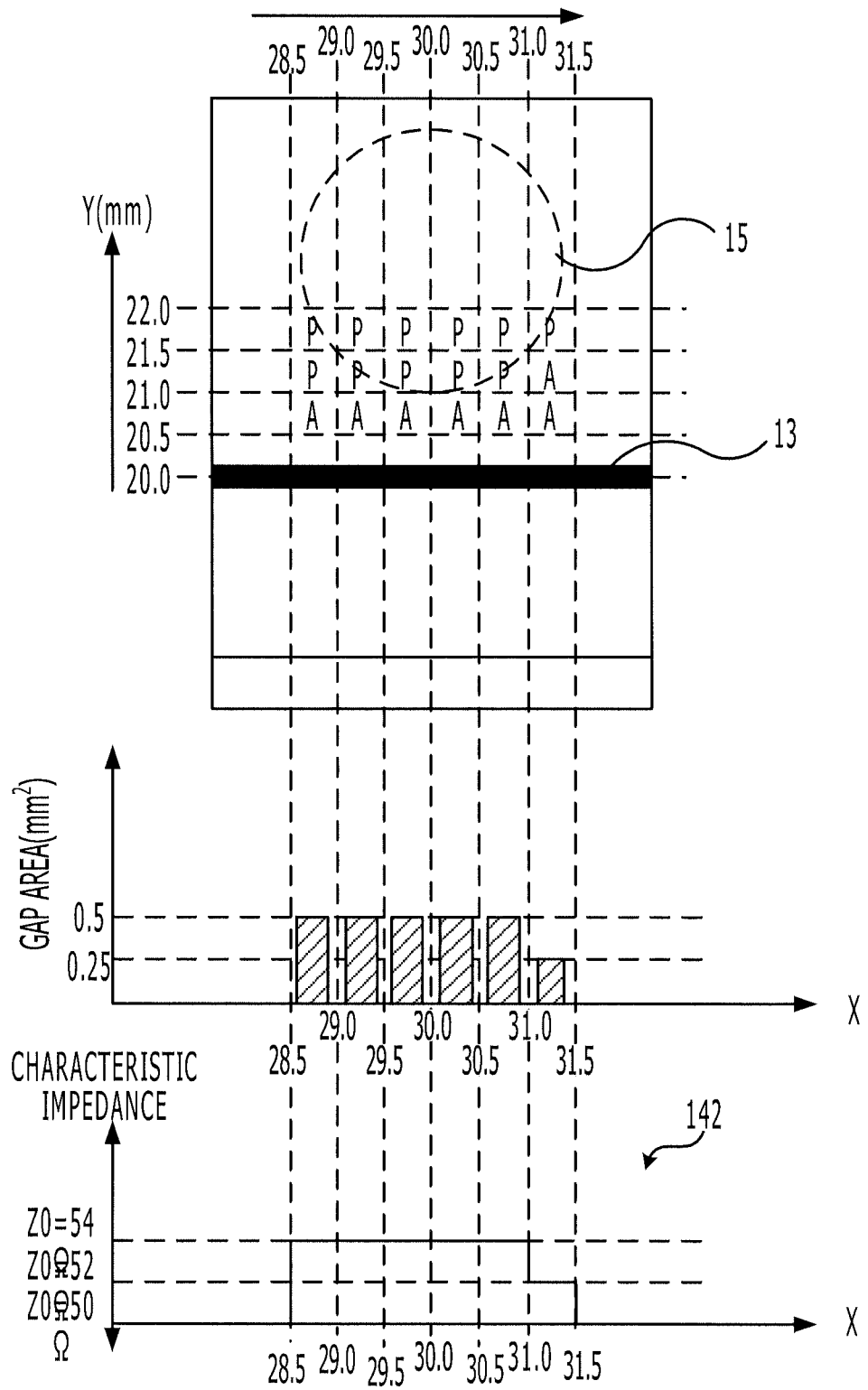
FIG. 27 illustrates a model representing wire-model characteristic impedances affected by the gap-region model illustrated in FIG. 25.

FIG. 27 illustrates a model representing wire-model characteristic impedances affected by the gap-region model illustrated in FIG. 25. The characteristic-impedance calculating unit 140b creates a model 142 on the basis of the characteristics illustrated in FIG. 23 and the determination results illustrated in FIG. 26.

By using the characteristics illustrated in FIG. 23 and the determination results illustrated in FIG. 26, the characteristic-impedance calculating unit 140b calculates a characteristic impedance affected by the gap region in each section of the wire model.

An amount of increase in the characteristic impedance in each section of the wire model is determined by equation (7):

Amount of Increase=Increase Coefficient×Area of Gap Region in Section (7).

The increase coefficient is a coefficient for one of characteristics (A) to (C) illustrated in FIG. 23. In each section, the gap-region model 15 exists at one side of the wire model 13. Thus, when the characteristic (C) illustrated in FIG. 23 is used, the characteristic impedance of the section of X=28.5 to 29.0 is 4Ω, the characteristic impedance of the section of X=29.0 to 29.5 is 4Ω, the characteristic impedance of the section of X=29.5 to 30.0 is 4Ω, the characteristic impedance of the section of X=30.0 to 30.5 is 4Ω, the characteristic impedance of the section of X=30.5 to 31.0 is 4Ω, and the characteristic impedance of the section of X=31.0 to 31.5 is 2Ω.

In the manner described above, the characteristic-impedance calculating unit 140b determines the amount of increase for each section of the wire model 13. The characteristic-impedance calculating unit 140b may similarly calculate the amount of increase with respect to the wire model 14.

FIG. 28 illustrates results of calculation of the characteristic impedances of the sections of the wire model, the calculation being performed by the wire-spacing verification apparatus of the fourth embodiment.

FIG. 28 illustrates, in a tabular form, data of the results of calculation of the characteristic impedances of the wire models 13 and 14 illustrated in FIG. 27. After the calculation is performed by the characteristic-impedance calculating unit 140, the data is stored in the HDD 103. The X and Y coordinates in FIG. 28 represent coordinates of the start point of each section. Although FIG. 28 illustrates only calculation results of sections of (X, Y)=(28.5, 20.0) to (31.5, 20.0), calculation for all sections of the wire models 13 and 14 which are specified by an attribute condition and so on is performed in practice.

In a "characteristic impedance" column illustrated in FIG. 28, a value obtained by adding the amount of increase, determined by the characteristic-impedance calculating unit 140b in accordance with equation (7), to the characteristic impedance calculated in the approximation processing illustrated in FIG. 10 is set.

Figure 29:
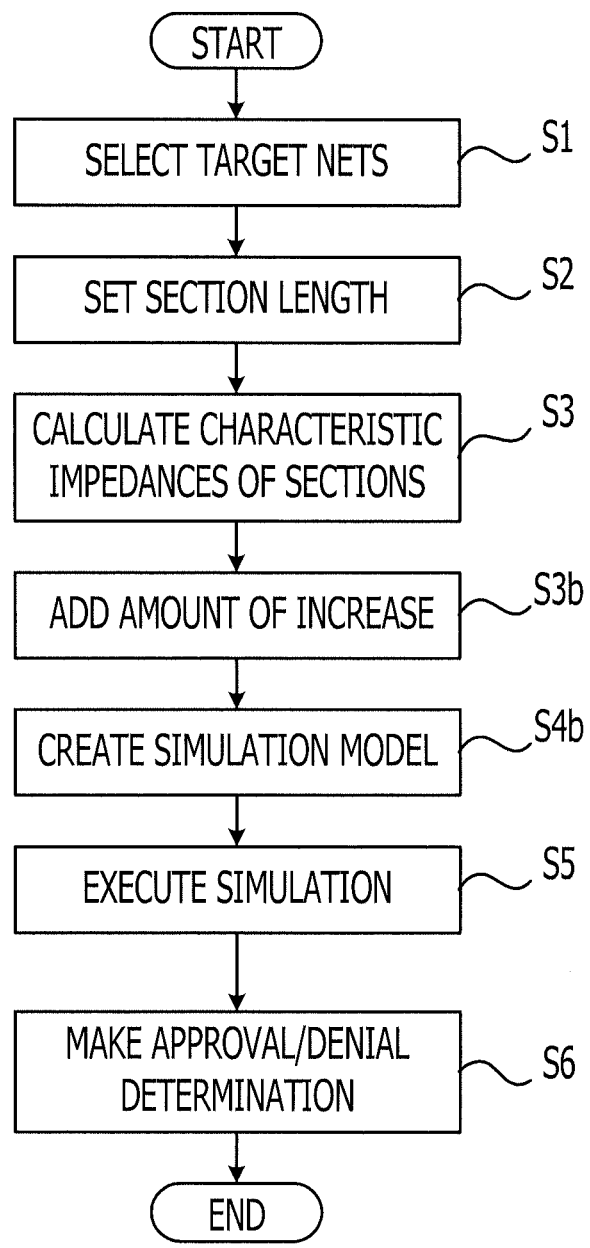
FIG. 29 illustrates overall processing of the wire-spacing verification apparatus according to the fourth embodiment.

Next, a description will be given of processing of the wire-spacing verification apparatus 100b according to the fourth embodiment. FIG. 29 is a flowchart illustrating overall processing of the wire-spacing verification apparatus of the fourth embodiment. Processing operations that are substantially the same as the processing operations in the second embodiment are denoted by the same operation numerals and descriptions thereof are not given hereinafter.

In operation S3b, the characteristic-impedance calculating unit 140b calculates an amount of increase in the characteristic-impedance calculation section, the increase being caused by the gap portion. The characteristic-impedance calculating unit 140b then adds the determined amount of increase to the characteristic impedance determined in operation S3. Thereafter, the process proceeds to operation S4b.

In operation S4b, the model creating unit 150 creates a simulation model on the basis of the characteristic impedances calculated in operation S3b. Thereafter, the process proceeds to operation S5. The description of the overall processing of the wire-spacing verification apparatus 100b according to the fourth embodiment is finished at this point.

The wire-spacing verification apparatus of the fourth embodiment provides substantially the same advantage as the wire-spacing verification apparatus 100 of the second embodiment.

According to the wire-spacing verification apparatus 100b of the fourth embodiment, even when a gap exists in a wide-region conductor (a solid conductor) that serves as a reference for the characteristic impedances, the use of a scheme for determining the influence of the gap makes it possible to execute simulation taking combined factors into account.

Although the wire-spacing verification program and the wire-spacing verification apparatus according to the present invention are described above in conjunction with the illustrated embodiments, the present invention is not limited thereto. The configurations of the units may be replaced with any elements having similar functions. Any other element or process may also be added to the present invention.

Additionally, in the present embodiment, two or more arbitrary elements (or features) in the above-described embodiments may also be combined.

The processing of the wire-spacing verification apparatus 100, 100a, or 100b may also be executed by a plurality of apparatuses in a distributed manner. For example, the arrangement may be such that one apparatus performs processing up to the section-length calculation processing and another apparatus makes the wire-model approval/denial determination using the section length.

The functions of the above-described processing may be realized by a computer. In this case, a program in which details of the processing of the functions of the wire-spacing verification apparatus 100, 100a, or 100b are written is supplied. When the program is executed by the computer, the above-described processing functions are realized on the computer. The program in which the details of the processing are written may be recorded to a computer-readable recording medium. Examples of the computer-readable recording medium include a magnetic recording device, an optical disk, a magneto optical recording medium, and a semiconductor memory. Examples of the magnetic recording device include a hard disk device (HDD), a flexible disk (FD), a magnetic tape. Examples of the optical disk include a DVD (Digital Versatile Disc), a DVD-RAM (Random Access Memory), a CD-ROM (Compact Disc-Read Only Memory), and a CD-R (Recordable)/RW (ReWritable). One example of the magneto-optical recording medium is an MO (magneto-optical disk). The computer-readable recording medium may be non-transitory.

For distribution of the program, portable recording media (such as DVDs and CD-ROMs) on which the program is recorded may be made commercially available. The program may also be stored in a storage device in a server computer so that the program can be transferred therefrom to another computer through a network.

A computer that executes a wire-spacing verification program may store, in the storage device thereof, the program recorded on the portable recording medium or the like or transferred from the server computer. The computer then reads the program from the storage device thereof and executes processing according to the program. The computer may also directly read the program from the portable recording medium and execute the processing according to the program. In addition, each time the program is transferred from the server computer, the computer may sequentially execute the processing according to the received program.

All examples and conditional language recited herein are intended for pedagogical purposes to aid the reader in understanding the principles of the invention and the concepts contributed by the inventor to furthering the art, and are to be construed as being without limitation to such specifically recited examples and conditions. Although the embodiments of the present inventions have been described in detail, it should be understood that various changes, substitutions, and alterations could be made hereto without departing from the spirit and scope of the invention.

The invention claimed is:

1. A wire-spacing verification method for a computer, the method comprising:
    calculating, by one or more processors of the computer, a characteristic impedance of each wire model disposed in a substrate model based on a propagation rate of a signal in the wire model and rise time or fall time of an element model for transmitting the signal;
    calculating, by the one or more processors of the computer, a reference impedance for predetermined sections of the wire model;
    creating, by the one or more processors of the computer, a distribution map in a direction of a section length with respect to the characteristic impedance of each of the sections for which the reference impedance is calculated;
    calculating, by the one or more processors of the computer, an index indicating a degree of mismatch with the reference impedance based on the created distribution map; and
    making, by the one or more processors of the computer, an approval/denial determination on the wire model based on the index.

2. A non-transitory computer-readable medium storing a wire-spacing verification program, which when executed by a computer, causes the computer to execute:
    calculating a characteristic impedance of each wire model disposed in a substrate model based on a propagation rate of a signal in the wire model and rise time or fall time of an element model for transmitting the signal;
    calculating a reference impedance for predetermined sections of the wire model;
    creating a distribution map in a direction of a section length with respect to the characteristic impedance of each of the sections for which the reference impedance is calculated;
    calculating an index indicating a degree of mismatch with the reference impedance based on the created distribution map; and
    making an approval/denial determination on the wire model based on the index.

3. The non-transitory computer-readable medium according to claim 2, wherein the computer further executes:
    setting, after calculating the reference impedance, the section length based on a coefficient determined so that an amplitude of a reflection wave in the sections is smaller than or equal to a predetermined multiple of an amplitude of an incoming wave.

4. The non-transitory computer-readable medium according to claim 2, wherein the index is a summation value of, in the distribution map, areas surrounded by the reference impedance and the characteristic impedances of the sections.

5. The non-transitory computer-readable medium according to claim 4, wherein, during the calculation of the index, when the area for each section is smaller than or equal to a predetermined reference value, the area for the section is excluded from the areas for the summation.

6. The non-transitory computer-readable medium according to claim 5, wherein, during the calculation of the index, the reference value is calculated based on rise time or fall time of the signal propagated by the wire model in the sections.

7. The non-transitory computer-readable medium according to claim 2, wherein, during the calculation of the reference impedance, the wire model whose characteristic impedance is to be calculated is narrowed down according to an attribute set for the wire model.

8. The non-transitory computer-readable medium according to claim 2, wherein, for calculation of the reference impedance, an amount of increase in the characteristic impedance, the increase being caused by a gap region in the substrate model, is determined and a value obtained by adding the amount of increase in the characteristic impedance to the characteristic impedance of the wire model in each section is used as the characteristic impedance of the section.

9. The non-transitory computer-readable medium according to claim 2, wherein the computer further executes:
    detecting a change point in a physical shape or a dielectric characteristic of the wire model; and
    wherein, during the calculation of the reference impedance, the section length is set for predetermined sections at two opposite sides of the change point detected in the detecting, with the change point being a center of the predetermined sections.

10. A wire-spacing verification apparatus, comprising:
    a calculating unit that calculates a characteristic impedance of each wire model disposed in a substrate model based on a propagation rate of a signal in the wire model and rise time or fall time of an element model for transmitting the signal, and that calculates a reference impedance for predetermined sections of the wire model;
    a creating unit that creates a distribution map in a direction of a section length with respect to the characteristic impedance of each of the sections for which the reference impedance is calculated; and
    a determining unit that calculates an index indicating a degree of mismatch with the reference impedance based on the created distribution map, and that makes an approval/denial determination on the wire model based on the index.

* * * * *